United States Patent
Kanamura

(10) Patent No.: US 9,461,135 B2
(45) Date of Patent: Oct. 4, 2016

(54) NITRIDE SEMICONDUCTOR DEVICE WITH MULTI-LAYER STRUCTURE ELECTRODE HAVING DIFFERENT WORK FUNCTIONS

(71) Applicant: FUJITSU LIMITED, Kawasaki-shi, Kanagawa (JP)

(72) Inventor: Masahito Kanamura, Isehara (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 14/551,576

(22) Filed: Nov. 24, 2014

(65) Prior Publication Data

US 2015/0162413 A1 Jun. 11, 2015

(30) Foreign Application Priority Data

Dec. 9, 2013 (JP) .................................. 2013-254111

(51) Int. Cl.
| | |
|---|---|
| *H01L 29/47* | (2006.01) |
| *H01L 29/778* | (2006.01) |
| *H01L 29/66* | (2006.01) |
| *H01L 29/417* | (2006.01) |
| *H01L 29/423* | (2006.01) |
| *H01L 29/20* | (2006.01) |

(52) U.S. Cl.
CPC ....... *H01L 29/475* (2013.01); *H01L 29/41766* (2013.01); *H01L 29/42316* (2013.01); *H01L 29/66462* (2013.01); *H01L 29/7783* (2013.01); *H01L 29/2003* (2013.01); *H01L 2224/0603* (2013.01); *H01L 2224/48247* (2013.01); *H01L2224/48472* (2013.01); *H01L 2224/4903* (2013.01); *H01L 2924/181* (2013.01)

(58) Field of Classification Search
CPC ........... H01L 29/475; H01L 29/41766; H01L 29/42316; H01L 29/778–29/8128
See application file for complete search history.

(56) References Cited

U.S. PATENT DOCUMENTS 4,632,713 A * 12/1986 Tiku .................. H01L 21/28581
257/260
5,060,031 A * 10/1991 Abrokwah ............ H01L 29/802
257/192

(Continued)

FOREIGN PATENT DOCUMENTS

| JP | 2009-38392 A1 | 2/2009 |
| JP | 2002-359256 A1 | 12/2009 |

(Continued)

OTHER PUBLICATIONS

Uncredited "Common Work Functions" article from pulsedpower.net which was archived by Wayback Machine webarchive as of Jul. 13, 2008 and is available online at www.pulsepower.net/Info/WorkFunctions.htm as of Aug. 23, 2015 pp. 1.*

*Primary Examiner* — Matthew Landau
*Assistant Examiner* — Grant Withers
(74) *Attorney, Agent, or Firm* — Kratz, Quintos & Hanson, LLP

(57) ABSTRACT

A semiconductor device includes first, a second, and third semiconductor layers respectively made of a nitride semiconductor and stacked on a substrate, a drain electrode formed on the third semiconductor layer, a gate electrode formed on the third semiconductor layer, and a source electrode formed within an opening penetrating the third and second semiconductor layers and exposing the first semiconductor layer. The source electrode includes a first conductor layer in contact with the first semiconductor layer, and a second conductor layer stacked on the first conductor layer and in contact with the second semiconductor layer. A work function of a material forming the first conductor layer is smaller than that of a material forming the second conductor layer.

20 Claims, 24 Drawing Sheets

(56) References Cited

U.S. PATENT DOCUMENTS

| | | | |
|---|---|---|---|
| 6,307,232 B1* | 10/2001 | Akiyama | H01L 21/8258 257/129 |
| 6,476,431 B1* | 11/2002 | Ohno | H01L 29/1075 257/192 |
| 7,038,252 B2* | 5/2006 | Saito | H01L 29/1066 257/103 |
| 7,075,125 B2* | 7/2006 | Saito | H01L 29/7787 257/194 |
| 7,078,743 B2 | 7/2006 | Murata | |
| 7,250,641 B2* | 7/2007 | Saito | H01L 27/0605 257/189 |
| 7,298,123 B2* | 11/2007 | Watanabe | H01L 29/7787 257/E29.253 |
| 7,339,207 B2 | 3/2008 | Murata | |
| 7,759,700 B2* | 7/2010 | Ueno | H01L 23/3732 257/12 |
| 8,003,525 B2* | 8/2011 | Okamoto | H01L 21/76898 257/E21.577 |
| 8,304,809 B2* | 11/2012 | Kaya | H01L 29/0611 257/192 |
| 8,624,265 B2* | 1/2014 | Saito | H01L 29/0623 257/77 |
| 2001/0023964 A1* | 9/2001 | Wu | H01L 29/66462 257/368 |
| 2002/0017696 A1* | 2/2002 | Nakayama | H01L 21/28587 257/471 |
| 2003/0020092 A1* | 1/2003 | Parikh | H01L 29/518 257/192 |
| 2003/0183844 A1* | 10/2003 | Yokoyama | H01L 29/0619 257/192 |
| 2003/0213975 A1* | 11/2003 | Hirose | H01L 29/7787 257/194 |
| 2005/0001235 A1* | 1/2005 | Murata | H01L 29/7787 257/192 |
| 2005/0279992 A1* | 12/2005 | Gupta | H01L 21/823807 257/24 |
| 2006/0011915 A1* | 1/2006 | Saito | H01L 29/1066 257/65 |
| 2006/0073621 A1* | 4/2006 | Kneissel | H01L 29/66462 438/21 |
| 2006/0081897 A1* | 4/2006 | Yoshida | H01L 21/8252 257/289 |
| 2006/0157735 A1* | 7/2006 | Kanamura | H01L 29/42316 257/194 |
| 2006/0197107 A1* | 9/2006 | Kanamura | H01L 29/7787 257/194 |
| 2006/0278892 A1* | 12/2006 | Harris | H01L 29/7783 257/194 |
| 2007/0051977 A1* | 3/2007 | Saito | H01L 29/7787 257/192 |
| 2007/0131968 A1* | 6/2007 | Morita | H01L 21/28581 257/192 |
| 2007/0187717 A1* | 8/2007 | Sadaka | H01L 29/1029 257/192 |
| 2007/0228415 A1* | 10/2007 | Kanamura | H01L 29/2003 257/192 |
| 2008/0230786 A1* | 9/2008 | Heikman | H01L 29/402 257/76 |
| 2009/0008679 A1* | 1/2009 | Saito | H01L 29/404 257/199 |
| 2009/0072272 A1* | 3/2009 | Suh | H01L 29/1066 257/194 |
| 2009/0166815 A1* | 7/2009 | Makiyama | H01L 21/28264 257/640 |
| 2009/0194791 A1* | 8/2009 | Kanamura | H01L 29/42368 257/192 |
| 2009/0267078 A1* | 10/2009 | Mishra | H01L 29/2003 257/76 |
| 2009/0283776 A1* | 11/2009 | Iwamuro | H01L 29/7839 257/76 |
| 2009/0321854 A1* | 12/2009 | Ohta | H01L 27/0605 257/411 |
| 2010/0213503 A1* | 8/2010 | Yanagihara | H01L 23/481 257/130 |
| 2010/0230717 A1* | 9/2010 | Saito | H01L 29/0692 257/140 |
| 2010/0314666 A1* | 12/2010 | Saito | H01L 29/0619 257/201 |
| 2010/0320505 A1* | 12/2010 | Okamoto | H01L 29/045 257/192 |
| 2011/0079771 A1* | 4/2011 | Kanamura | H01L 29/778 257/24 |
| 2011/0272708 A1* | 11/2011 | Yoshioka | H01L 21/28264 257/77 |
| 2012/0032188 A1* | 2/2012 | Kanamura | H01L 21/0217 257/76 |
| 2012/0061729 A1* | 3/2012 | Shibata | H01L 29/66462 257/194 |
| 2012/0091522 A1* | 4/2012 | Ozaki | H01L 23/291 257/330 |
| 2012/0138944 A1* | 6/2012 | Kanamura | H01L 29/66462 257/66 |
| 2012/0138958 A1* | 6/2012 | Fujikawa | H01L 21/02378 257/77 |
| 2012/0139630 A1* | 6/2012 | Ozaki | H01L 21/02057 330/250 |
| 2012/0153300 A1* | 6/2012 | Lidow | H01L 21/743 257/77 |
| 2012/0223319 A1* | 9/2012 | Dora | H01L 29/2003 257/76 |
| 2013/0069115 A1* | 3/2013 | Nakazawa | H01L 29/402 257/192 |
| 2013/0082307 A1* | 4/2013 | Okamoto | H01L 21/28581 257/279 |
| 2013/0134443 A1* | 5/2013 | Terano | H01L 29/205 257/77 |
| 2013/0141156 A1* | 6/2013 | Teo | H01L 29/7783 327/530 |
| 2013/0161698 A1* | 6/2013 | Marino | H01L 29/42316 257/194 |
| 2013/0248928 A1* | 9/2013 | Yoshioka | H01L 29/4175 257/192 |
| 2013/0256686 A1* | 10/2013 | Kanamura | H01L 29/205 257/76 |
| 2013/0256690 A1* | 10/2013 | Nakamura | H01L 29/2003 257/76 |
| 2014/0001557 A1* | 1/2014 | Mishra | H01L 29/7786 257/367 |
| 2014/0021511 A1* | 1/2014 | Jeon | H01L 29/778 257/194 |
| 2014/0091424 A1* | 4/2014 | Makiyama | H01L 29/66431 257/472 |
| 2014/0094223 A1* | 4/2014 | Dasgupta | H01L 29/66462 455/566 |
| 2014/0169045 A1* | 6/2014 | Ueno | H01L 21/0465 363/37 |
| 2014/0197418 A1* | 7/2014 | Chen | H01L 21/0254 257/76 |
| 2014/0209893 A1* | 7/2014 | Okamoto | H01L 29/045 257/43 |
| 2014/0264379 A1* | 9/2014 | Kub | H01L 29/41725 257/77 |
| 2014/0346526 A1* | 11/2014 | Kanamura | H01L 29/66462 257/76 |
| 2015/0048421 A1* | 2/2015 | Park | H01L 29/66462 257/194 |
| 2015/0060875 A1* | 3/2015 | Kume | H01L 29/7835 257/76 |
| 2015/0144953 A1* | 5/2015 | Hill | H01L 29/402 257/76 |
| 2015/0162413 A1* | 6/2015 | Kanamura | H01L 29/475 257/76 |
| 2015/0179782 A1* | 6/2015 | Yamamura | H01L 29/205 257/76 |
| 2015/0325660 A1* | 11/2015 | Hitora | H01L 29/7722 257/43 |
| 2016/0056145 A1* | 2/2016 | Nagumo | H01L 29/66462 257/76 |

FOREIGN PATENT DOCUMENTS

| | | |
|---|---|---|
| JP | 2010-109086 A1 | 5/2010 |
| JP | 2011-249500 A1 | 12/2011 |

* cited by examiner

NITRIDE SEMICONDUCTOR DEVICE WITH MULTI-LAYER STRUCTURE ELECTRODE HAVING DIFFERENT WORK FUNCTIONS

CROSS-REFERENCE TO RELATED APPLICATIONS

This application is based upon and claims the benefit of priority of the prior Japanese Patent Application No. 2013-254111, filed on Dec. 9, 2013, the entire contents of which are incorporated herein by reference.

FIELD

The embodiments discussed herein are related to a semiconductor device and a method of manufacturing the semiconductor device.

BACKGROUND

Materials such as GaN, AlN, and InN, which are nitride semiconductors, mixed crystals of such nitride semiconductors, or the like have a wide band gap and are thus used in high-output electron devices, short-wavelength light emitting devices, or the like. For example, GaN, which is a nitride semiconductor, has a band gap of 3.4 eV which is large compared to a band gap of 1.1 eV for Si and a band gap of 1.4 eV for GaAs.

The high-output electron devices include FETs (Field Effect Transistors), and particularly HEMTs (High Electron Mobility Transistors), as proposed in Japanese Laid-Open Patent Publication No. 2002-359256, for example. The HEMT using the nitride semiconductor is used for a high-output high-efficiency amplifier, a high-power switching device, or the like. More particularly, in the HEMT that uses AlGaN for an electron supply layer and GaN for a channel layer, piezoelectric polarization or the like is generated due to a distortion caused by a difference between lattice constants of AlGaN and GaN, and 2DEG (2-Dimensional Electron gas) having a high concentration is generated. For this reason, this HEMT can operate at a high voltage, and may be used for a high-efficiency switching element, a high withstand voltage power device of an electric vehicle, or the like.

Related art are also proposed in Japanese Laid-Open Patent Publications No. 2009-38392, No. 2010-109086, and No. 2011-249500, for example.

However, with respect to the HEMT using the nitride semiconductor, there are demands to enable operation of the HEMT in a high-frequency region, and studies are being made on gate electrodes having a short gate length using a short-gate technique. In general, in order to operate the semiconductor device in the high-frequency region, ON-resistance of the semiconductor device is preferably low.

SUMMARY

Accordingly, it is an object in one aspect of the embodiment to provide a semiconductor device that uses a nitride semiconductor, has a low ON-resistance, and is operable in a high-frequency region, and to provide a method of manufacturing such a semiconductor device.

According to one aspect of the present invention, a semiconductor device includes a first semiconductor layer made of a nitride semiconductor and formed on a substrate; a second semiconductor layer made of a nitride semiconductor and formed on the first semiconductor layer; a third semiconductor layer made of a nitride semiconductor and formed on the second semiconductor layer; a drain electrode formed on the third semiconductor layer; a gate electrode formed on the third semiconductor layer; and a source electrode formed within an opening penetrating the third and second semiconductor layers and exposing the first semiconductor layer, wherein the source electrode includes a first conductor layer in contact with the first semiconductor layer, and a second conductor layer stacked on the first conductor layer and in contact with the second semiconductor layer, and wherein a work function of a material forming the first conductor layer is smaller than a work function of a material forming the second conductor layer.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Figure 1:
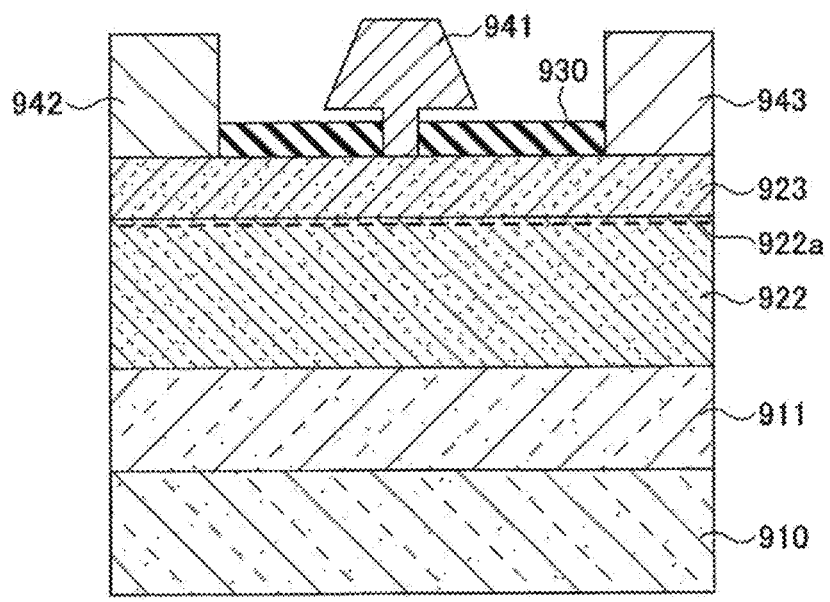
FIG. 1 is a diagram illustrating a configuration of an example of a semiconductor device.

Preferred embodiments of the present invention will be described with reference to the accompanying drawings.

A description will now be given of the semiconductor device and the method of manufacturing the semiconductor device in each embodiment according to the present invention. In the following description, those parts that are the same are designated by the same reference numerals, and a description thereof will be omitted.

A description will be given of an example of a conventional semiconductor device, by referring to FIG. 1. FIG. 1 is a diagram illustrating a configuration of the example of the conventional semiconductor device. The semiconductor device illustrated in FIG. 1 includes a buffer layer 911, a channel layer 922, and an electron supply layer 923 that are successively stacked on a substrate 910 by MOVPE (Metal Organic Vapor Phase Epitaxy).

For example, the substrate 910 is formed by a Si substrate or the like, which is an example of a semiconductor substrate. The buffer 911 is made of AlN or the like having a thickness of approximately 3 µm. The channel layer 922 is made of i-GaN having a thickness of approximately 3 µm. The electron supply layer 923 is made of i-$Al_{0.25}Ga_{0.75}N$ having a thickness of approximately 20 nm. Hence, a 2DEG 922a is generated in the channel layer 922 at a vicinity of an interface between the channel layer 922 and the electron supply layer 923. A source electrode 942 and a drain electrode 943 respectively made of a metal stacked layer of Ti/Al (that is, a combination of a Ti layer and an Al layer), are formed at predetermined regions on the electron supply layer 923. After forming the source electrode 942 and the drain electrode 943, SiN or the like is formed on a surface of the electron supply layer 923 by plasma CVD (Chemical Vapor Deposition) in order to form a protection layer 930. A gate electrode 941 is formed by removing the protection layer 930 in a region where the gate electrode 941 is to be formed, and forming the gate electrode 941 on the electron supply layer 923 in the region in which the protection layer 930 is removed. The gate electrode 941 is made of a metal stacked layer of Ni/Au (that is, a combination of an Ni layer and an Au layer), and a gate length of the gate electrode 941 is approximately 0.1 µm.

In the semiconductor device illustrated in FIG. 1, the ON-resistance is high because the contact resistance between the source electrode 942 that is made of the metal stacked layer of Ti/Al and the electron supply layer 923 that is made of i-$Al_{0.25}Ga_{0.75}N$ is high. For this reason, there are proposals to perform ion implantation of Si into the electron supply layer 923 in a region immediately under the source electrode 942, or to regrow an n-type layer having a high impurity concentration, in order to reduce the contact resistance. However, these proposals make the manufacturing process complex, and increase the cost of the semiconductor device. In addition, these proposals reach a high temperature during the manufacturing process when performing activation anneal or regrowth, and the heat may damage the semiconductor device that is manufactured. For this reason, the semiconductor device manufactured according to these proposals may not be able to obtain desired characteristics, and the yield may deteriorate.

[First Embodiment]

(Semiconductor Device)

Figure 2:
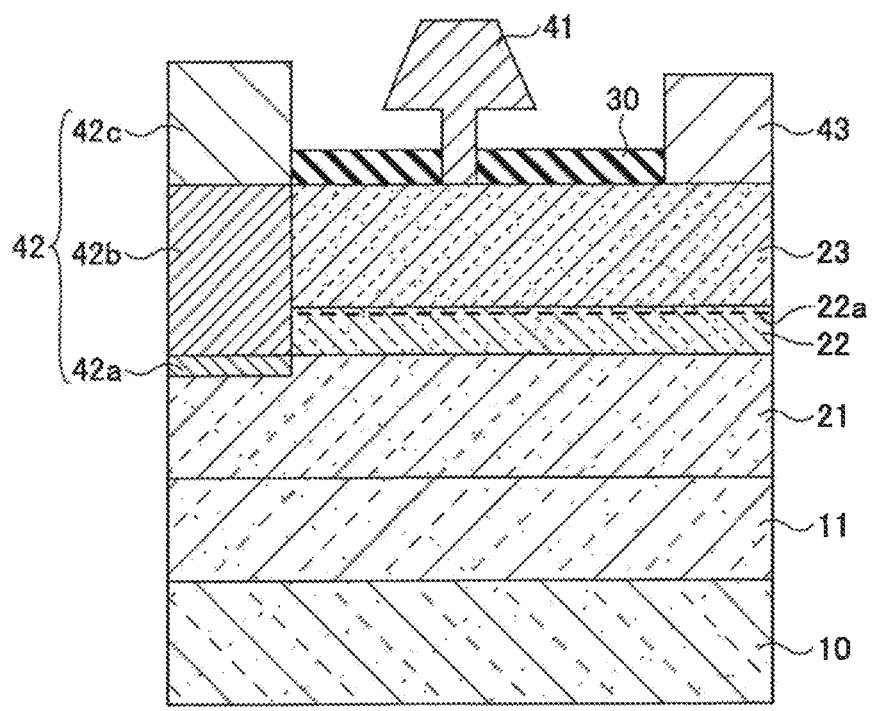
FIG. 2 is a diagram illustrating a configuration of an example of a semiconductor device in a first embodiment.

Next, a description will be given of a semiconductor device in a first embodiment, by referring to FIG. 2. FIG. 2 is a diagram illustrating a configuration of an example of the semiconductor device in the first embodiment. As illustrated in FIG. 2, the semiconductor device in this embodiment includes a buffer layer 11 formed by a nitride semiconductor, a p-type layer 21 forming a first semiconductor layer, a channel layer 22 forming a second semiconductor layer, and an electron supply layer 23 forming a third semiconductor layer that are successively stacked on a substrate 10.

The substrate 10 may be made of non-doped Si (silicon), SiC (silicon carbide), $Al_2O_3$ (sapphire), GaN, or the like. The substrate 10 is preferably made of a material that is not conductive, and is made of a semiinsulating material or an insulating material that is highly insulative. In this embodiment, the substrate 10 is made of SiC. The buffer 11 is made of AlN or the like having a thickness of approximately 0.5 µm.

The p-type layer 21 forming the first semiconductor layer is made of p-GaN having a thickness of approximately 0.5 µm, and is doped with an impurity element, Mg, to a concentration of $1 \times 10^{17}/cm^3$. The channel layer 22 forming the second semiconductor layer is made of i-GaN having a thickness of approximately 0.2 µm. The electron supply layer 23 forming the third semiconductor layer is made of n-$Al_{0.25}Ga_{0.75}N$ having a thickness of approximately 20 nm, and is doped with an impurity element, Si, to a concentration of $1 \times 10^{18}/cm^3$. Hence, a 2DEG 22a is generated in the channel layer 22 at a vicinity of an interface between the channel layer 22 and the electron supply layer 23. Although not illustrated in FIG. 2, a cap layer made of n-GaN or the like may be formed on the electron supply layer 23 forming the third semiconductor layer. In addition, the third semiconductor layer may be i-AlGaN which is not doped with an impurity element, and further, may be made of a material including one of AlGaN, InGaAlN, and InAlN.

A source electrode 42 is formed by removing a part of the electron supply layer 23, the channel layer 22, and the p-type layer 21 in a region where the source electrode 42 is to be formed, and filling the region where a part of the nitride semiconductor layer is removed with a conductive material such as a metal material or the like. A drain electrode 43 is formed on the electron supply layer 23. A protection layer 30 is formed in an exposed region of the electron supply layer 23, not formed with the source electrode 42 and the drain electrode 43, by SiN or the like. The protection layer 30 may be formed by a material other than SiN, such as $SiO_2$, $Al_2O_3$, AlN, $HfO_2$, or the like. The protection layer 30 may be formed by plasma CVD, ALD (Atomic Layer Deposition), sputtering, MOCVD (Metal Organic Vapor Phase Epitaxy), MBE (Molecular Beam Epitaxy), or the like.

A gate electrode 41 is formed by removing the protection layer 30 in a region where the gate electrode 41 is to be formed, and forming the gate electrode 41 on the electron supply layer 23 in the region in which the protection layer 30 is removed. The drain electrode 43 is made of a metal stacked layer of Ti/Al, and the gate electrode 41 is made of a metal stacked layer of Ni/Au.

In this embodiment, the source electrode 42 is formed by successively stacking a first conductor layer 42a, a second conductor layer 42b, and a third conductor layer 42c. In this embodiment, the first conductor layer 42a of the source electrode 42 and the p-type layer 21 forming the first semiconductor layer form an ohmic contact. In addition, the second conductor layer 42b of the source electrode 42 and the channel layer 22 forming the second semiconductor layer, and the second conductor layer 42b of the source electrode 42 and the electron supply layer 23 forming the third semiconductor layer respectively form a Schottky junction.

Accordingly, the first conductor layer 42a is made of a material having a relatively small work function, and more particularly, a material having a work function that is less than 5.0 eV, and preferably a material having a work function that is less than 4.5 eV, in order to form the ohmic contact with the p-type layer 21 forming the first semiconductor layer. For example, the first conductor layer 42a may be made of a material including at least one of materials in Table 1 having a work function that is less than 5.0 eV, namely, Ti (titanium), Ta (tantalum), Mo (molybdenum), Nb (niobium), W (tungsten), Hf (hafnium), TaN (tantalum nitride), TiN (titanium nitride), or the like. In addition, the first conductor layer 42a may preferably be made of a material including at least one of the materials selected from Table 1 and having a work function that is less than 4.5 eV, namely, Ti, Ta, Nb, Hf, TaN, or the like.

TABLE 1

|  | Work Function (eV) |
| --- | --- |
| Hf | 3.9 |
| TaN | 4.05 |
| Ta | 4.25 |
| Al | 4.28 |
| Nb | 4.3 |
| Ti | 4.33 |
| W | 4.55 |
| Mo | 4.6 |
| TiN | 4.7 |
| Au | 5.1 |
| Pd | 5.12 |
| Ni | 5.15 |
| Ir | 5.27 |
| Pt | 5.65 |

Further, the second conductor layer 42b is made of a material having a relatively large work function, and more particularly, a material having a work function that is 5.0 eV or greater, in order to form the Schottky junction with the electron supply layer 23 forming the third semiconductor layer. For example, the second conductor layer 42b may be made of a material including at least one of materials selected from Table 1 and having a work function that is 5.0 eV or greater, namely, Ni (nickel), Pt (platinum), Pd (palladium), Ir (iridium), Au (gold), or the like.

The third conductor layer 42c is made of a material having a high conductivity, in order to generally reduce the resistance at the source electrode 42. More particularly, the third conductor layer 42c may be made of a material including at least one material selected from Al (aluminum), Au, Cu (copper), or the like having a high conductivity.

Although not illustrated in FIG. 2, a fourth conductor layer may be formed on the third conductor layer 42c at the source electrode 42. That is, because the third conductor layer 42c is made of a material that is physically weak with respect to heat, the fourth conductor layer made of a metal material or the like that is physically strong against heat may be formed as a cap layer for protecting the third conductor layer 42c.

In this embodiment, an interface between the first conductor layer 42a and the second conductor layer 42b of the source electrode 42 preferably has the same height as an interface between the p-type layer 21 forming the first semiconductor layer and the channel layer 22 forming the second semiconductor layer. In addition, an interface between the second conductor layer 42b and the third conductor layer 42c of the source electrode 42 preferably has the same height as the electron supply layer 23, and further, preferably has the same height as an interface between the electron supply layer 23 and the protection layer 30.

(Characteristics of Semiconductor Device)

Figure 3:
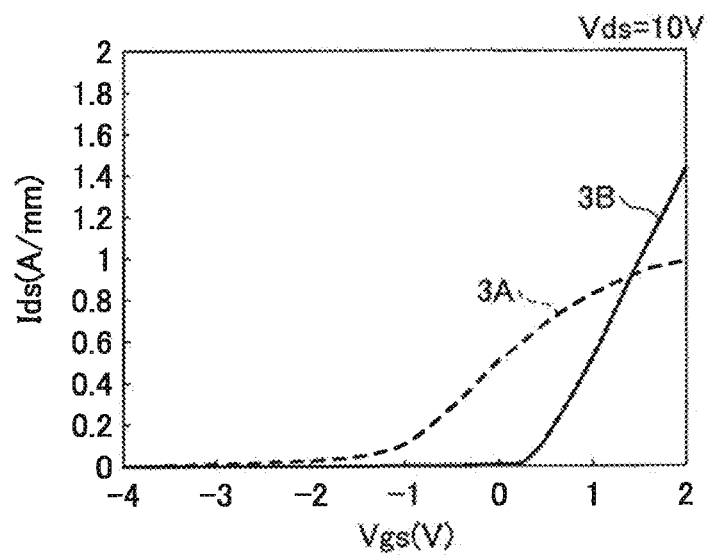
FIG. 3 is a diagram illustrating an example of an Ids versus Vgs characteristic of the semiconductor device.

Next, a description will be given of characteristics of the semiconductor device in this embodiment, by referring to FIGS. 3 and 4. FIG. 3 is a diagram illustrating an example of an Ids versus Vgs characteristic (hereinafter also referred to as an "Ids-Vgs characteristic") of the semiconductor device, where Ids denotes a drain current flowing between the source electrode and the drain electrode, and Vgs denotes a gate voltage applied to the gate electrode. A drain voltage Vds of 10 V is applied between the drain electrode and the source electrode. In FIG. 3, 3A denotes the characteristic of the semiconductor device having the configuration illustrated in FIGS. 1, and 3B denotes the characteristic of the semiconductor device in this embodiment having the configuration illustrated in FIG. 2.

As illustrated in FIG. 3, the semiconductor device in this embodiment can make a slope of sharp compared to that of the semiconductor device illustrated in FIG. 1, and can thus make the ON-resistance lower than that of the semiconductor device illustrated in FIG. 1. For this reason, the semiconductor device in this embodiment can be operated at a high speed, and the operation in the high-frequency region becomes possible. In addition, the semiconductor device in this embodiment can operate the gate voltage more towards positive side compared to the semiconductor device illustrated in FIG. 1, and can thus be normally-OFF.

Figure 4:
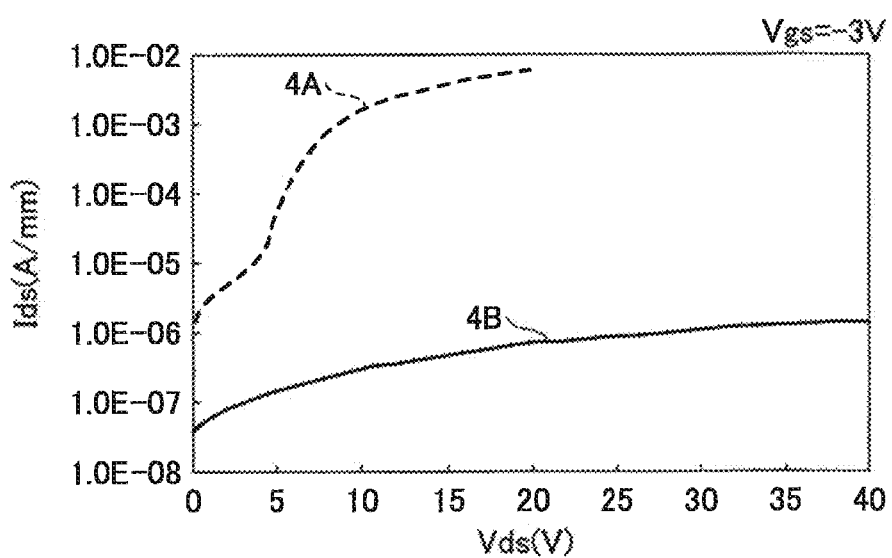
FIG. 4 is a diagram illustrating an example of an Ids versus Vds characteristic of the semiconductor device.

FIG. 4 is a diagram illustrating an example of an Ids versus Vds characteristic (hereinafter also referred to as an "Ids-Vds characteristic") of the semiconductor device, where Vds denotes a drain voltage applied between the source electrode and the drain electrode. FIG. 4 illustrates a case in which the gate voltage Vgs of −3 V is applied. In FIG. 4, 4A denotes the characteristic of the semiconductor device having the configuration illustrated in FIGS. 1, and 4B denotes the characteristic of the semiconductor device in this embodiment having the configuration illustrated in FIG. 2. As illustrated in FIG. 4, the semiconductor device in this embodiment can make the drain current Ids low in an OFF state compared to that of the semiconductor device illustrated in FIG. 1, and can thus make a leak current low compared to that of the semiconductor device illustrated in FIG. 1.

Figure 5A:
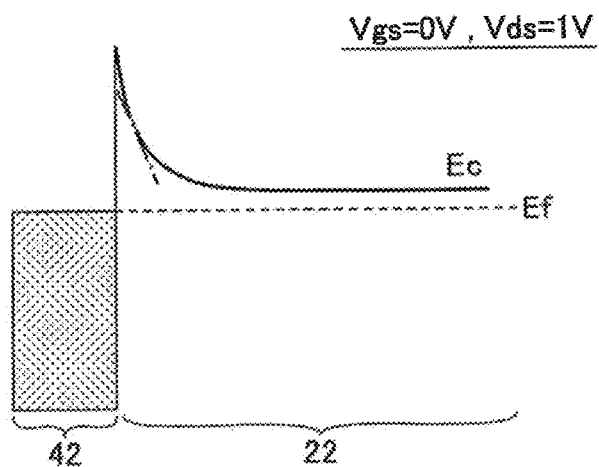
FIGS. 5A and 5B are diagrams for explaining the semiconductor device in the first embodiment.
Figure 5B:
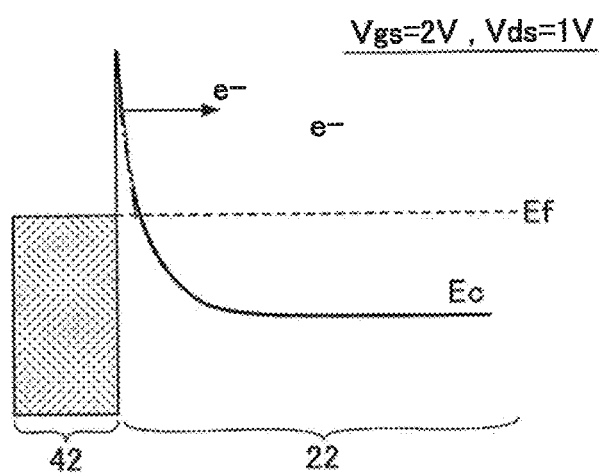

Next, a description will be given of the operation of the semiconductor device in this embodiment, by referring to FIGS. 5A and 5B. FIGS. 5A and 5B are diagrams for explaining the semiconductor device in the first embodiment, and more particularly are energy band diagrams at a junction part between the source electrode 42 and the channel layer 22 forming the second semiconductor layer.

FIG. 5A illustrates a state for a case in which the drain voltage Vds is 1 V and the gate voltage Vgs is 0 V. In the state illustrated in FIG. 5A, the Schottky barrier between the source electrode 42 and the channel layer 22 is high, and a lower end of a conduction band Ec of the channel layer 22 is higher than a Fermi level Ef. Hence, no electrons flow from the source electrode 42 towards the channel layer 22, and the semiconductor device assumes the OFF state.

On the other hand, FIG. 5B illustrates a state for a case in which the drain voltage Vds is IV and the gate voltage Vgs is 2 V. In the state illustrated in FIG. 5B, the Schottky barrier between the source electrode 42 and the channel layer 22 is low, and the lower end of the conduction band Ec of the channel layer 22 is lower than the Fermi level Ef. Hence, electrons flow from the source electrode 42 towards the channel layer 22 by tunneling through the Schottky barrier by the tunneling effect. In addition, because the electrons accelerated by the high electric field rides over the Schottky barrier, the semiconductor device assumes the ON state.

When the electrons accelerated by the high electric field and having the high energy state reach the channel layer 22, electrons and holes are generated within the channel layer 22 due to impact ionization of the electrons. However, in this embodiment, the holes that are generated flow to the source electrode 42 via the p-type layer 21 forming the first semiconductor layer, and it is possible to prevent the withstand voltage from decreasing.

(Method of Manufacturing Semiconductor Device)

Next, a description will be given of the method of manufacturing the semiconductor device in this embodiment, by referring to FIGS. 6A through 8B. FIGS. 6A, 6B, 7A, 7B, 8A, and 8B are diagrams for explaining the method of manufacturing the semiconductor device in the first embodiment.

Figure 6A:
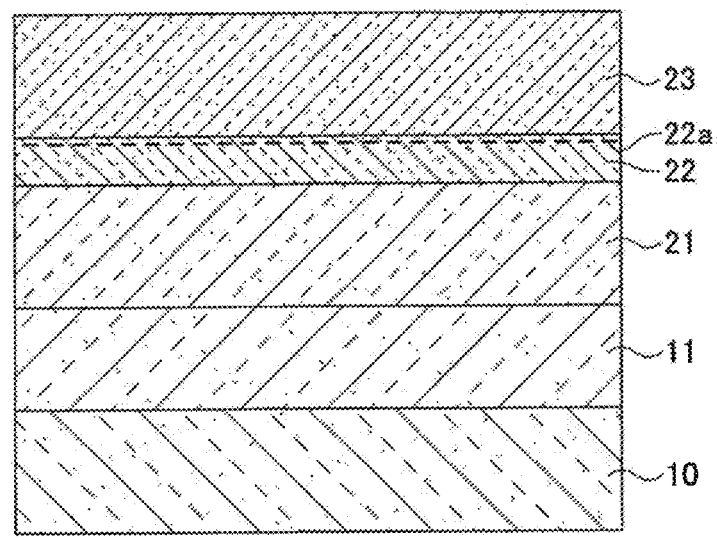
FIGS. 6A and 6B are diagrams for explaining a method of manufacturing the semiconductor device in the first embodiment.

First, the nitride semiconductor layers, such as the buffer layer 11, the p-type layer 21 forming the first semiconductor layer, the channel layer 22 forming the second semiconductor layer, and the electron supply layer 23 forming the third semiconductor layer, are successively stacked on the substrate 10 by MOVPE, as illustrated in FIG. 6A. In this embodiment, the substrate 10 is formed by a SiC substrate, and the buffer layer 11 is made of AlN or the like having a thickness of approximately 0.5 μm.

The p-type layer 21 forming the first semiconductor layer is made of p-GaN having a thickness of approximately 0.5 μm, and is doped with an impurity element, Mg, to a concentration of $1 \times 10^{17}/cm^3$. The channel layer 22 forming the second semiconductor layer is made of i-GaN having a thickness of approximately 0.2 μm. The electron supply layer 23 forming the third semiconductor layer is made of n-$Al_{0.25}Ga_{0.75}N$ having a thickness of approximately 20 nm, and is doped with an impurity element, Si, to a concentration of $1 \times 10^{18}/cm^3$. Hence, the 2DEG 22a is generated in the channel layer 22 at the vicinity of the interface between the channel layer 22 and the electron supply layer 23.

Thereafter, an element isolation region that is not illustrated in FIG. 6A is formed. More particularly, a photoresist layer is coated on the surface of the electron supply layer 23, and this photoresist layer is exposed by an exposure apparatus and developed in order to form a resist pattern that is not illustrated in FIG. 6A. This resist pattern has an opening in a region in which the element isolation region is to be formed. Then, the nitride semiconductor layer within the opening of the resist pattern is removed by a dry etching using a chlorine gas, or by ion implantation of Ar (argon) ions or the like, in order to form the element isolation region. The resist pattern is thereafter removed by an organic solvent or the like.

Figure 6B:
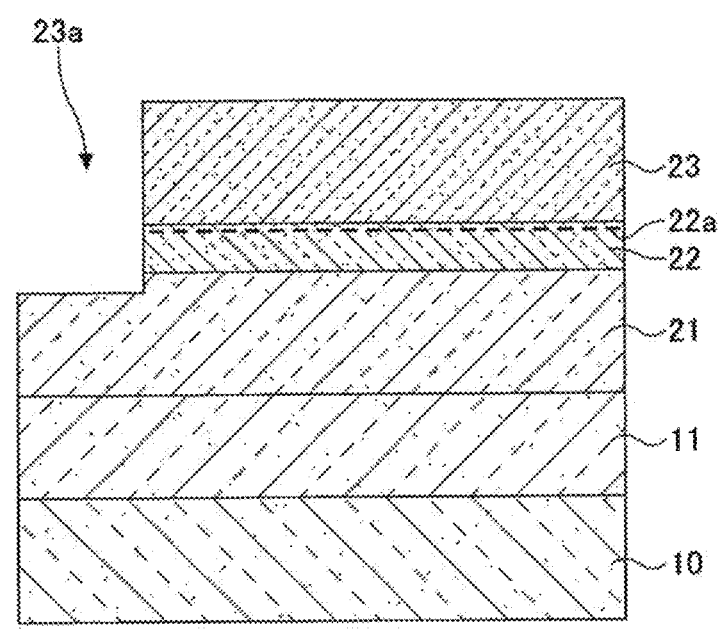

Next, as illustrated in FIG. 6B, an opening 23a is formed by removing a part of the electron supply layer 23, the channel layer 22, and the p-type layer 21 in a region where the source electrode 42 is to be formed. More particularly, a photoresist layer is formed on the electron supply layer 23, and this photoresist layer is exposed by the exposure apparatus and developed, in order to form a resist pattern that is not illustrated in FIG. 6B. This resist pattern has an opening in a region in which the source electrode 42 is to be formed. Then, a part of the electron supply layer 23, the channel layer 22, and the p-type layer 21 within the opening of the resist pattern is removed by a dry etching using a chlorine gas, in order to form the opening 23a. The resist pattern is thereafter removed by an organic solvent or the like. The dry etching to remove the part of the electron supply layer 23, the channel layer 22, and the p-type layer 21 within the opening of the resist pattern may be an RIE (Reactive Ion Etching) or the like.

Figure 7A:
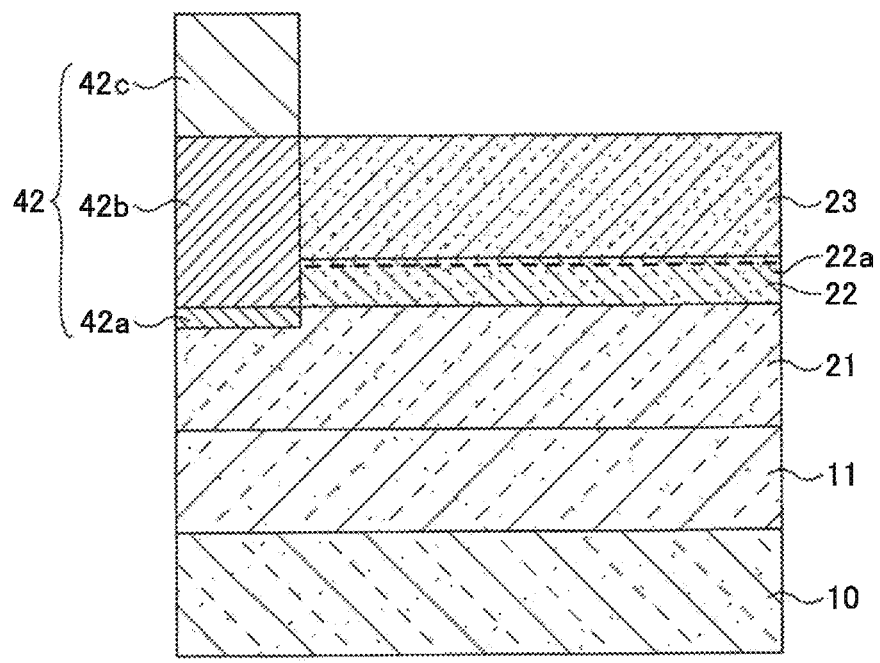
FIGS. 7A and 7B are diagrams for explaining the method of manufacturing the semiconductor device in the first embodiment.

Next, as illustrated in FIG. 7A, the source electrode 42 is formed in the opening 23a. More particularly, a photoresist layer is formed on the surface of the electron supply layer 23, and this photoresist layer is exposed by the exposure apparatus and developed, in order to form a resist pattern that is not illustrated in FIG. 7A. This resist pattern has an opening in a region in which the source electrode 42 is to be formed. Then, stacked metal layers are formed on the resist pattern by successively stacking a metal layer forming the first conductor layer 42a, a metal layer forming the second conductor layer 42b, and a metal layer forming the third conductor layer 42c, by vacuum deposition. The stacked structure is thereafter dipped in an organic solvent or the like, in order to remove the stacked metal layers formed on the resist pattern, together with the resist pattern, by lift-off, and form the source electrode 42 by the remaining stacked metal layers. In this embodiment, the first conductor layer 42a is formed by a Ti layer having a thickness of approximately 20 nm, the second conductor layer 42b is formed by an Ni layer having a thickness of approximately 200 nm, and the third conductor layer 42c is formed by an Al layer having a thickness of approximately 50 nm. Hence, a Schottky junction is formed between the second conductor layer 42b of the source electrode 42 and the channel layer 22 forming the second semiconductor layer, and between the second conductor layer 42b of the source electrode 42 and the electron supply layer 23 forming the third semiconductor layer.

Figure 7B:
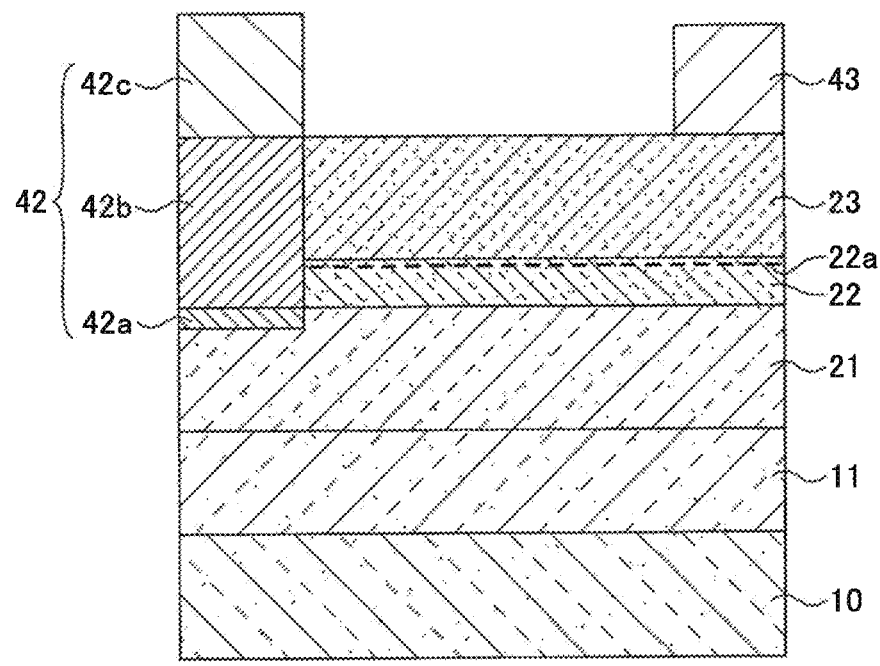

Next, as illustrated in FIG. 7B, the drain electrode 43 is formed on the electron supply layer 23 forming the third semiconductor layer. More particularly, a photoresist layer is formed on the electron supply layer 23, and this photoresist layer is exposed by the exposure apparatus and developed, in order to form a resist pattern that is not illustrated in FIG. 7B. This resist pattern has an opening in a region in which the drain electrode 43 is to be formed. Then, stacked metal layers formed by Ti/Al are formed on the resist pattern by vacuum deposition. The stacked structure is thereafter dipped in an organic solvent or the like, in order to remove the stacked metal layers formed on the resist pattern, together with the resist pattern, by lift-off, and form the drain electrode 43 by the remaining stacked metal layers. The stacked structure is thereafter subjected to a heat treatment at 600° C. for 1 minute under a nitrogen environment, in order to establish the ohmic contact at the drain electrode 43. In this state, an ohmic contact is also established between the first conductor layer 42*a* of the source electrode 42 and the p-type layer 21 forming the first semiconductor layer.

Figure 8A:
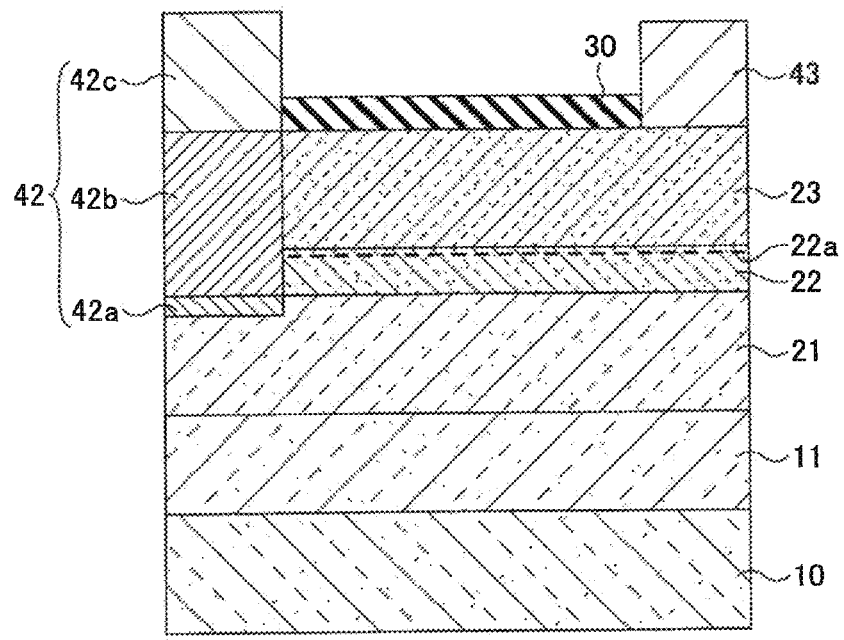
FIGS. 8A and 8B are diagrams for explaining the method of manufacturing the semiconductor device in the first embodiment.

Next, as illustrated in FIG. 8A, the protection layer 30 is formed on the electron supply layer 23 forming the third semiconductor layer. More particularly, an SiN layer is formed on the electron supply layer 23 by plasma CVD, in order to form the protection layer 30.

Figure 8B:
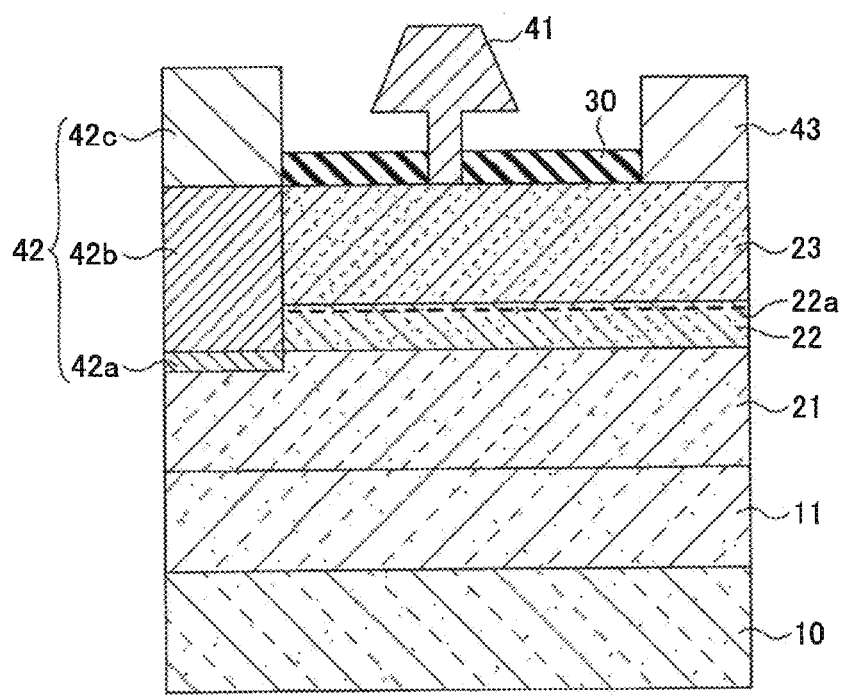

Next, as illustrated in FIG. 8B, a region of the protection layer 30 where the gate electrode 41 is to be formed is removed, in order to expose the electron supply layer 23 within this region and form the gate electrode 41. More particularly, an EB (Electron Beam) resist layer or the like is coated on the protection layer 30, and this EB resist layer is exposed by an EB exposure of an EB lithography (or exposure) apparatus and developed, in order to form a 3-layer resist pattern having an opening in a region where the gate electrode 41 is to be formed. The protection layer 30 within the opening of this 3-layer resist pattern is removed by an RIE or the like, in order to expose the surface of the electron supply layer 23 within the opening of this 3-layer resist layer. Then, metal stacked layers formed by Ni/Au are formed on the resist pattern by vacuum deposition. The stacked structure is thereafter dipped in an organic solvent or the like, in order to remove the stacked metal layers formed on the resist pattern, together with the resist pattern, by lift-off, and form the gate electrode 41 by the remaining stacked metal layers. In this embodiment, a gate length of the gate electrode 41 that is formed is approximately 0.1 μm.

(Modification)

Figure 9:
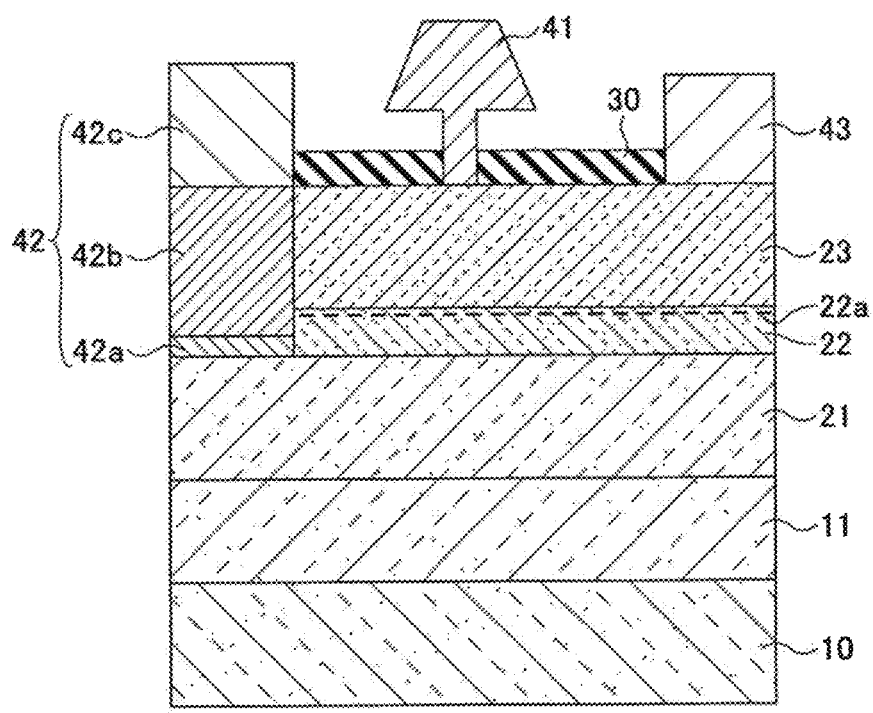
FIG. 9 is a diagram illustrating a configuration of another example of the semiconductor device in the first embodiment.

FIG. 9 is a diagram illustrating a configuration of another example of the semiconductor device in the first embodiment. In other words, in a modification of this embodiment, the source electrode 42 of the semiconductor device may be formed in a region in which a part of or all of the electron supply layer 23 forming the third semiconductor layer and the channel layer 22 forming the second semiconductor layer is removed. In this case, the second conductor layer 42*b* of the source electrode 42 makes contact with the electron supply layer 23 and the channel layer 22, in order to form a Schottky junction.

In the embodiment described above, the p-type layer 21 forming the first semiconductor layer is made of p-GaN doped with an impurity element, Mg. However, in the semiconductor device in this modification of the embodiment, the p-type layer 21 forming the first semiconductor layer simply needs to be doped with an impurity element that makes the p-type layer 21 the p-type, and the impurity element may be C (carbon), for example. In a case in which the p-type layer 21 forming the first semiconductor layer is doped with the impurity element, C, the impurity element, C, is doped to a concentration of $1\times10^{17}/cm^3$.

[Second Embodiment]
(Semiconductor Device)

Figure 10:
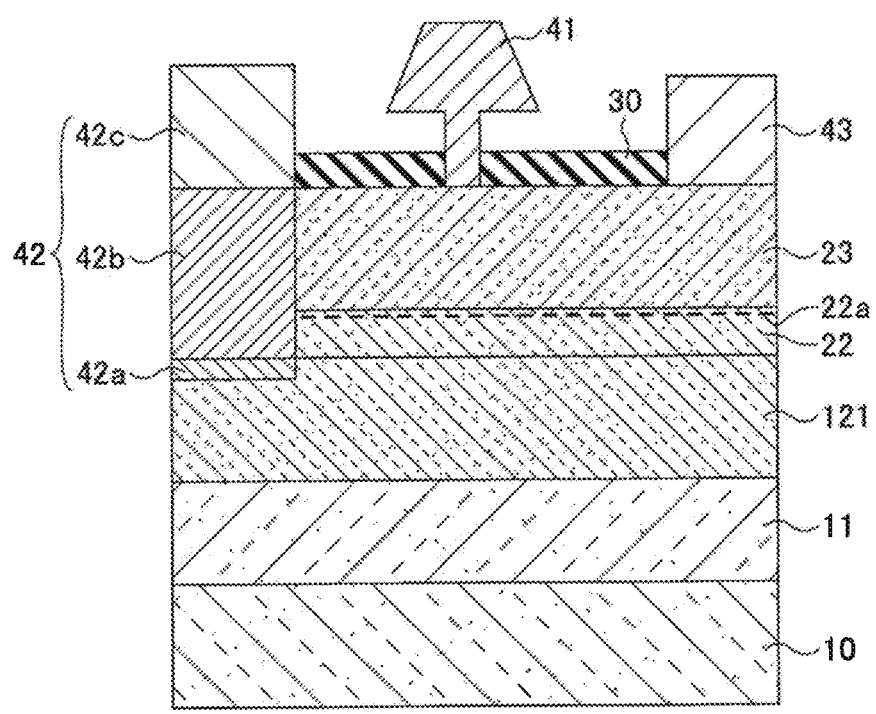
FIG. 10 is a diagram illustrating a configuration of an example of the semiconductor device in a second embodiment.

Next, a description will be given of the semiconductor device in a second embodiment, by referring to FIG. 10. FIG. 10 is a diagram illustrating a configuration of an example of the semiconductor device in the second embodiment. As illustrated in FIG. 10, the semiconductor device in this embodiment includes a buffer layer 11 formed by a nitride semiconductor, a non-doped layer 121 forming a first semiconductor layer, a channel layer 22 forming a second semiconductor layer, and an electron supply layer 23 forming a third semiconductor layer that are successively stacked on a substrate 10.

The substrate 10 may be made of non-doped Si, SiC, $Al_2O_3$, GaN, or the like. The substrate 10 is preferably made of a material that is not conductive, and is made of a semiinsulating material or an insulating material that is highly insulative. In this embodiment, the substrate 10 is made of SiC. The buffer 11 is made of AlN or the like having a thickness of approximately 0.5 μm.

The non-doped layer 121 forming the first semiconductor layer is made of i-GaN having a thickness of approximately 0.5 μm. The channel layer 22 forming the second semiconductor layer is made of i-GaN having a thickness of approximately 0.2 μm. The electron supply layer 23 forming the third semiconductor layer is made of n-$Al_{0.25}Ga_{0.75}N$ having a thickness of approximately 20 nm, and is doped with an impurity element, Si, to a concentration of $1\times10^{18}/cm^3$. Hence, a 2DEG 22*a* is generated in the channel layer 22 at a vicinity of an interface between the channel layer 22 and the electron supply layer 23. Although not illustrated in FIG. 10, a cap layer made of n-GaN or the like may be formed on the electron supply layer 23 forming the third semiconductor layer.

A source electrode 42 is formed by removing a part of the electron supply layer 23, the channel layer 22, and the non-doped layer 121 in a region where the source electrode 42 is to be formed, and filling the region where a part of the nitride semiconductor layer is removed with a conductive material such as a metal material or the like. A drain electrode 43 is formed on the electron supply layer 23. A protection layer 30 is formed in an exposed region of the electron supply layer 23, not formed with the source electrode 42 and the drain electrode 43, by SiN or the like. The protection layer 30 may be formed by a material other than SiN, such as $SiO_2$, $Al_2O_3$, AlN, $HfO_2$, or the like. The protection layer 30 may be formed by plasma CVD, ALD, sputtering, MOCVD, MBE, or the like.

A gate electrode 41 is formed by removing the protection layer 30 in a region where the gate electrode 41 is to be formed, and forming the gate electrode 41 on the electron supply layer 23 in the region in which the protection layer 30 is removed. The drain electrode 43 is made of a metal stacked layer of Ti/Al, and the gate electrode 41 is made of a metal stacked layer of Ni/Au.

In this embodiment, the source electrode 42 is formed by successively stacking a first conductor layer 42*a*, a second conductor layer 42*b*, and a third conductor layer 42*c*. In this embodiment, the first conductor layer 42*a* of the source electrode 42 and the non-doped layer 121 forming the first semiconductor layer form an ohmic contact. In addition, the second conductor layer 42*b* of the source electrode 42 and the channel layer 22 forming the second semiconductor layer, and the second conductor layer 42*b* of the source electrode 42 and the electron supply layer 23 forming the third semiconductor layer respectively form a Schottky junction.

Accordingly, the first conductor layer 42*a* is made of a material having a relatively small work function, and more particularly, a material having a work function that is less than 5.0 eV, and preferably a material having a work function that is less than 4.5 eV, in order to form the ohmic contact with the non-doped layer 121 forming the first semiconductor layer. For example, the first conductor layer 42*a* may be made of the material including at least one of the materials in Table 1 having the work function that is less than 5.0 eV, namely, Ti, Ta, Mo, Nb, W, Hf, TaN, TiN, or the like. In addition, the first conductor layer 42a may preferably be made of the material including at least one of the materials selected from Table 1 and having the work function that is less than 4.5 eV, namely, Ti, Ta, Nb, Hf, TaN, or the like.

Further, the second conductor layer 42b is made of a material having a relatively large work function, and more particularly, a material having the work function that is 5.0 eV or greater, in order to form the Schottky junction with the electron supply layer 23 forming the third semiconductor layer. For example, the second conductor layer 42b may be made of the material including at least one of the materials selected form Table 1 and having the work function that is 5.0 eV or greater, namely, Ni, Pt, Pd, Ir, Au, or the like.

The third conductor layer 42c is made of a material having a high conductivity, in order to generally reduce the resistance at the source electrode 42. More particularly, the third conductor layer 42c may be made of the material including at least one material selected from Al, Au, Cu, or the like having a high conductivity.

Although not illustrated in FIG. 10, a fourth conductor layer may be formed on the third conductor layer 42c at the source electrode 42. That is, because the third conductor layer 42c is made of the material that is physically weak with respect to heat, the fourth conductor layer made of a metal material or the like that is physically strong against heat may be formed as a cap layer for protecting the third conductor layer 42c.

In this embodiment, an interface between the first conductor layer 42a and the second conductor layer 42b of the source electrode 42 preferably has the same height as an interface between the non-doped layer 121 forming the first semiconductor layer and the channel layer 22 forming the second semiconductor layer. In addition, an interface between the second conductor layer 42b and the third conductor layer 42c of the source electrode 42 preferably has the same height as the electron supply layer 23, and further, preferably has the same height as an interface between the electron supply layer 23 and the protection layer 30.

(Method of Manufacturing Semiconductor Device)

Next, a description will be given of the method of manufacturing the semiconductor device in this embodiment, by referring to FIGS. 11A through 13B. FIGS. 11A, 11B, 12A, 12B, 13A, and 13B are diagrams for explaining the method of manufacturing the semiconductor device in the second embodiment.

Figure 11A:
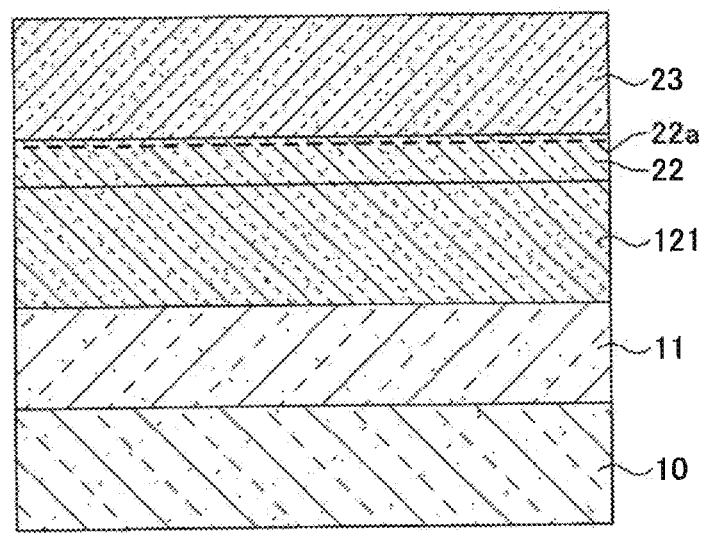
FIGS. 11A and 11B are diagrams for explaining a method of manufacturing the semiconductor device in the second embodiment.

First, the nitride semiconductor layers, such as the buffer layer 11, the non-doped layer 121 forming the first semiconductor layer, the channel layer 22 forming the second semiconductor layer, and the electron supply layer 23 forming the third semiconductor layer, are successively stacked on the substrate 10 by MOVPE, as illustrated in FIG. 11A. In this embodiment, the substrate 10 is formed by a SiC substrate, and the buffer layer 11 is made of AlN or the like having a thickness of approximately 0.5 μm.

The non-doped layer 121 forming the first semiconductor layer is made of i-GaN having a thickness of approximately 0.5 μm. The channel layer 22 forming the second semiconductor layer is made of i-GaN having a thickness of approximately 0.2 μm. The electron supply layer 23 forming the third semiconductor layer is made of n-$Al_{0.25}Ga_{0.75}N$ having a thickness of approximately 20 nm, and is doped with an impurity element, Si, to a concentration of $1\times10^{18}/cm^3$. Hence, the 2DEG 22a is generated in the channel layer 22 at the vicinity of the interface between the channel layer 22 and the electron supply layer 23.

Thereafter, an element isolation region that is not illustrated in FIG. 11A is formed. More particularly, a photoresist layer is coated on the surface of the electron supply layer 23, and this photoresist layer is exposed by an exposure apparatus and developed in order to form a resist pattern that is not illustrated in FIG. 11A. This resist pattern has an opening in a region in which the element isolation region is to be formed. Then, the nitride semiconductor layer within the opening of the resist pattern is removed by a dry etching using a chlorine gas, or by ion implantation of Ar ions or the like, in order to form the element isolation region. The resist pattern is thereafter removed by an organic solvent or the like.

Figure 11B:
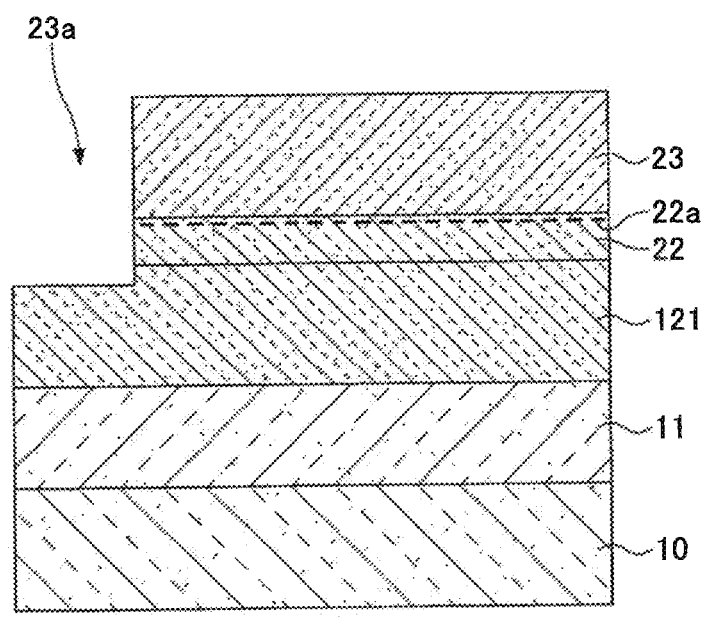

Next, as illustrated in FIG. 11B, an opening 23a is formed by removing a part of the electron supply layer 23, the channel layer 22, and the non-doped layer 121 in a region where the source electrode 42 is to be formed. More particularly, a photoresist layer is formed on the electron supply layer 23, and this photoresist layer is exposed by the exposure apparatus and developed, in order to form a resist pattern that is not illustrated in FIG. 11B. This resist pattern has an opening in a region in which the source electrode 42 is to be formed. Then, a part of the electron supply layer 23, the channel layer 22, and the non-doped layer 121 within the opening of the resist pattern is removed by a dry etching using a chlorine gas, in order to form the opening 23a. The resist pattern is thereafter removed by an organic solvent or the like. The dry etching to remove the part of the electron supply layer 23, the channel layer 22, and the non-doped layer 121 within the opening of the resist pattern may be an RIE or the like.

Figure 12A:
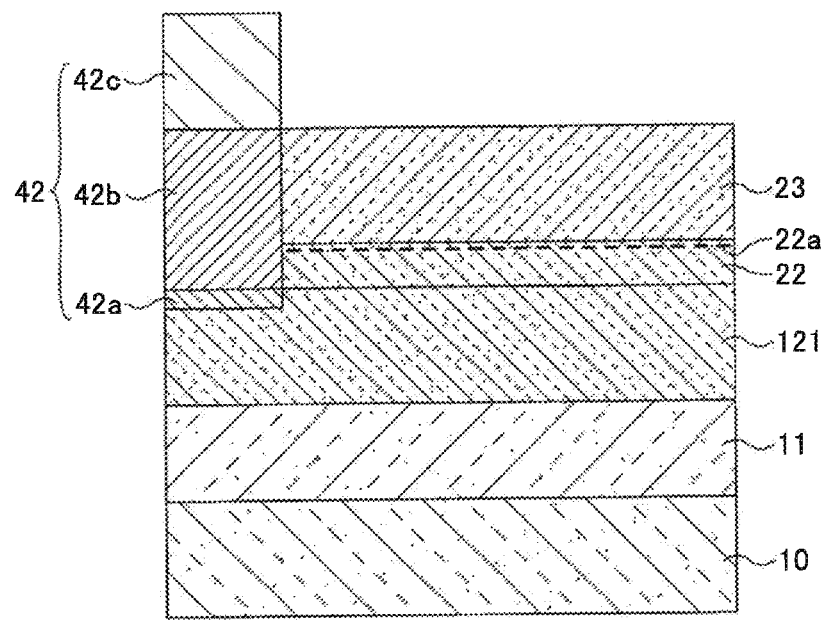
FIGS. 12A and 12B are diagrams for explaining the method of manufacturing the semiconductor device in the second embodiment.

Next, as illustrated in FIG. 12A, the source electrode 42 is formed in the opening 23a. More particularly, a photoresist layer is formed on the surface of the electron supply layer 23, and this photoresist layer is exposed by the exposure apparatus and developed, in order to form a resist pattern that is not illustrated in FIG. 12A. This resist pattern has an opening in a region in which the source electrode 42 is to be formed. Then, stacked metal layers are formed on the resist pattern by successively stacking a metal layer forming the first conductor layer 42a, a metal layer forming the second conductor layer 42b, and a metal layer forming the third conductor layer 42c, by vacuum deposition. The stacked structure is thereafter dipped in an organic solvent or the like, in order to remove the stacked metal layers formed on the resist pattern, together with the resist pattern, by lift-off, and form the source electrode 42 by the remaining stacked metal layers. In this embodiment, the first conductor layer 42a is formed by a Ti layer having a thickness of approximately 20 nm, the second conductor layer 42b is formed by an Ni layer having a thickness of approximately 200 nm, and the third conductor layer 42c is formed by an Al layer having a thickness of approximately 50 nm. Hence, a Schottky junction is formed between the second conductor layer 42b of the source electrode 42 and the channel layer 22 forming the second semiconductor layer, and between the second conductor layer 42b of the source electrode 42 and the electron supply layer 23 forming the third semiconductor layer.

Figure 12B:
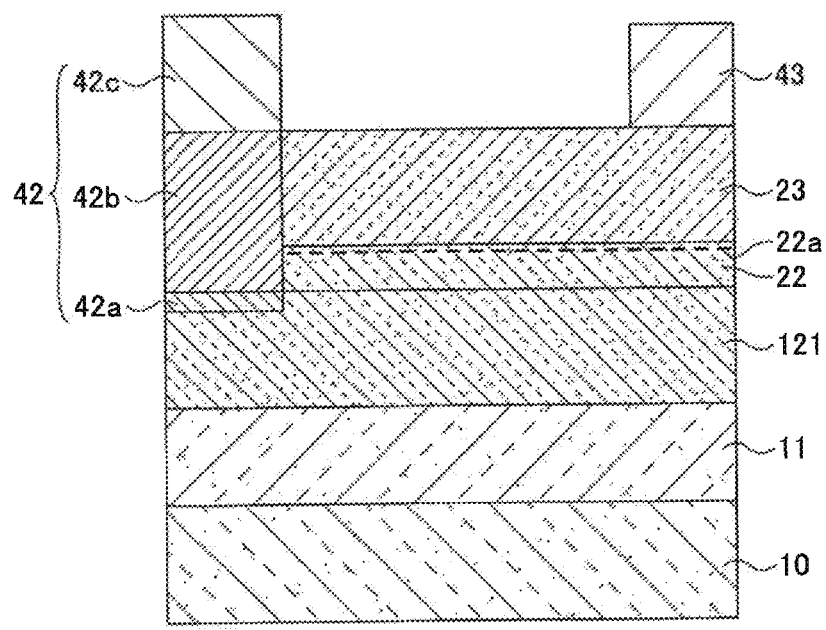

Next, as illustrated in FIG. 12B, the drain electrode 43 is formed on the electron supply layer 23 forming the third semiconductor layer. More particularly, a photoresist layer is formed on the electron supply layer 23, and this photoresist layer is exposed by the exposure apparatus and developed, in order to form a resist pattern that is not illustrated in FIG.

12B. This resist pattern has an opening in a region in which the drain electrode 43 is to be formed. Then, stacked metal layers formed by Ti/Al are formed on the resist pattern by vacuum deposition. The stacked structure is thereafter dipped in an organic solvent or the like, in order to remove the stacked metal layers formed on the resist pattern, together with the resist pattern, by lift-off, and form the drain electrode 43 by the remaining stacked metal layers. The stacked structure is thereafter subjected to a heat treatment at 600° C. for 1 minute under a nitrogen environment, in order to establish the ohmic contact at the drain electrode 43. In this state, an ohmic contact is also established between the first conductor layer 42a of the source electrode 42 and the non-doped layer 121 forming the first semiconductor layer.

Figure 13A:
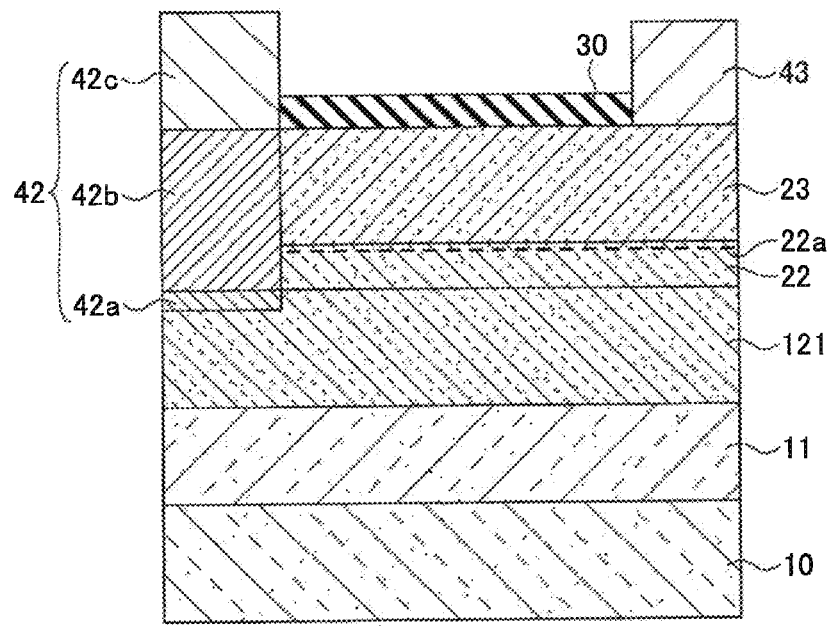
FIGS. 13A and 13B are diagrams for explaining the method of manufacturing the semiconductor device in the second embodiment.

Next, as illustrated in FIG. 13A, the protection layer 30 is formed on the electron supply layer 23 forming the third semiconductor layer. More particularly, an SiN layer is formed on the electron supply layer 23 by plasma CVD, in order to form the protection layer 30.

Figure 13B:
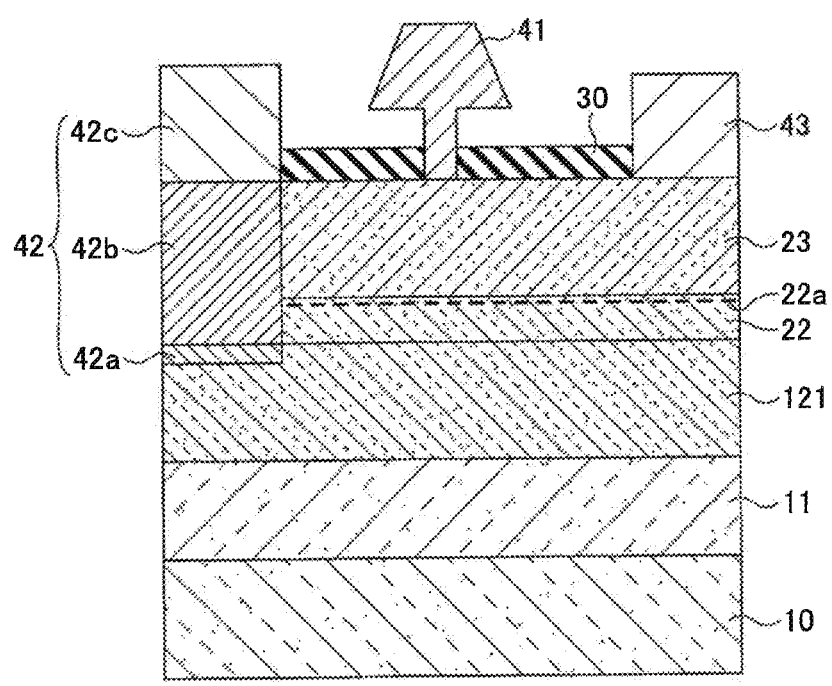

Next, as illustrated in FIG. 13B, a region of the protection layer 30 where the gate electrode 41 is to be formed is removed, in order to expose the electron supply layer 23 within this region and form the gate electrode 41. More particularly, an EB resist layer or the like is coated on the protection layer 30, and this EB resist layer is exposed by an EB exposure of an EB lithography (or exposure) apparatus and developed, in order to form a 3-layer resist pattern having an opening in a region where the gate electrode 41 is to be formed. The protection layer 30 within the opening of this 3-layer resist pattern is removed by an RIE or the like, in order to expose the surface of the electron supply layer 23 within the opening of this 3-layer resist layer. Then, metal stacked layers formed by Ni/Au are formed on the resist pattern by vacuum deposition. The stacked structure is thereafter dipped in an organic solvent or the like, in order to remove the stacked metal layers formed on the resist pattern, together with the resist pattern, by lift-off, and form the gate electrode 41 by the remaining stacked metal layers. In this embodiment, a gate length of the gate electrode 41 that is formed is approximately 0.1 μm.

Otherwise, the semiconductor device in this embodiment is similar in configuration and method of manufacture to the semiconductor device in the first embodiment described above.

[Third Embodiment]
(Semiconductor Device)

Figure 14:
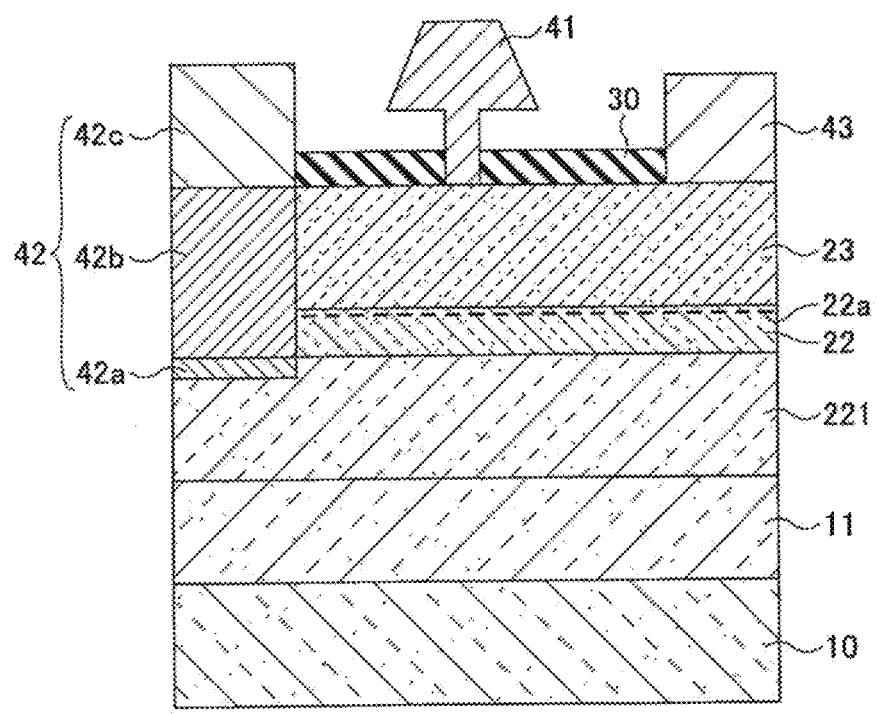
FIG. 14 is a diagram illustrating a configuration of an example of the semiconductor device in a third embodiment.

Next, a description will be given of the semiconductor device in a third embodiment, by referring to FIG. 14. FIG. 14 is a diagram illustrating a configuration of an example of the semiconductor device in the third embodiment. As illustrated in FIG. 14, the semiconductor device in this embodiment includes a buffer layer 11 formed by a nitride semiconductor, a semiinsulating semiconductor layer 221 forming a first semiconductor layer, a channel layer 22 forming a second semiconductor layer, and an electron supply layer 23 forming a third semiconductor layer that are successively stacked on a substrate 10.

The substrate 10 may be made of non-doped Si, SiC, $Al_2O_3$, GaN, or the like. The substrate 10 is preferably made of a material that is not conductive, and is made of a semiinsulating material or an insulating material that is highly insulative. In this embodiment, the substrate 10 is made of SiC. The buffer 11 is made of AlN or the like having a thickness of approximately 0.5 μm.

The semiinsulating semiconductor layer 221 forming the first semiconductor layer is made of GaN having a thickness of approximately 0.5 μm, and is doped with an impurity element, Fe (iron), to a concentration of $1 \times 10^{17}/cm^3$. The semiinsulating semiconductor layer 221 is made of semiinsulating GaN. The channel layer 22 forming the second semiconductor layer is made of i-GaN having a thickness of approximately 0.2 μm. The electron supply layer 23 forming the third semiconductor layer is made of n-$Al_{0.25}Ga_{0.75}N$ having a thickness of approximately 20 nm, and is doped with an impurity element, Si, to a concentration of $1 \times 10^{18}/cm^3$. Hence, a 2DEG 22a is generated in the channel layer 22 at a vicinity of an interface between the channel layer 22 and the electron supply layer 23. Although not illustrated in FIG. 14, a cap layer made of n-GaN or the like may be formed on the electron supply layer 23 forming the third semiconductor layer.

A source electrode 42 is formed by removing a part of the electron supply layer 23, the channel layer 22, and the semiinsulating semiconductor layer 221 in a region where the source electrode 42 is to be formed, and filling the region where a part of the nitride semiconductor layer is removed with a conductive material such as a metal material or the like. A drain electrode 43 is formed on the electron supply layer 23. A protection layer 30 is formed in an exposed region of the electron supply layer 23, not formed with the source electrode 42 and the drain electrode 43, by SiN or the like. The protection layer 30 may be formed by a material other than SiN, such as $SiO_2$, $Al_2O_3$, AlN, $HfO_2$, or the like. The protection layer 30 may be formed by plasma CVD, ALD, sputtering, MOCVD, MBE, or the like.

A gate electrode 41 is formed by removing the protection layer 30 in a region where the gate electrode 41 is to be formed, and forming the gate electrode 41 on the electron supply layer 23 in the region in which the protection layer 30 is removed. The drain electrode 43 is made of a metal stacked layer of Ti/Al, and the gate electrode 41 is made of a metal stacked layer of Ni/Au.

In this embodiment, the source electrode 42 is formed by successively stacking a first conductor layer 42a, a second conductor layer 42b, and a third conductor layer 42c. In this embodiment, the first conductor layer 42a of the source electrode 42 and the semiinsulating semiconductor layer 221 forming the first semiconductor layer form an ohmic contact. In addition, the second conductor layer 42b of the source electrode 42 and the channel layer 22 forming the second semiconductor layer, and the second conductor layer 42b of the source electrode 42 and the electron supply layer 23 forming the third semiconductor layer respectively form a Schottky junction.

Accordingly, the first conductor layer 42a is made of a material having a relatively small work function, and more particularly, a material having a work function that is less than 5.0 eV, and preferably a material having a work function that is less than 4.5 eV, in order to form the ohmic contact with the semiinsulating semiconductor layer 221 forming the first semiconductor layer. For example, the first conductor layer 42a may be made of the material including at least one of the materials in Table 1 having the work function that is less than 5.0 eV, namely, Ti, Ta, Mo, Nb, W, Hf, TaN, TiN, or the like. In addition, the first conductor layer 42a may preferably be made of the material including at least one of the materials selected from Table 1 and having the work function that is less than 4.5 eV, namely, Ti, Ta, Nb, Hf, TaN, or the like.

Further, the second conductor layer 42b is made of a material having a relatively large work function, and more particularly, a material having the work function that is 5.0 eV or greater, in order to form the Schottky junction with the electron supply layer 23 forming the third semiconductor layer. For example, the second conductor layer 42b may be made of the material including at least one of the materials selected form Table 1 and having the work function that is 5.0 eV or greater, namely, Ni, Pt, Pd, Ir, Au, or the like.

The third conductor layer 42c is made of a material having a high conductivity, in order to generally reduce the resistance at the source electrode 42. More particularly, the third conductor layer 42c may be made of the material including at least one material selected from Al, Au, Cu, or the like having a high conductivity.

Although not illustrated in FIG. 14, a fourth conductor layer may be formed on the third conductor layer 42c at the source electrode 42. That is, because the third conductor layer 42c is made of the material that is physically weak with respect to heat, the fourth conductor layer made of a metal material or the like that is physically strong against heat may be formed as a cap layer for protecting the third conductor layer 42c.

In this embodiment, an interface between the first conductor layer 42a and the second conductor layer 42b of the source electrode 42 preferably has the same height as an interface between the semiinsulating semiconductor layer 221 forming the first semiconductor layer and the channel layer 22 forming the second semiconductor layer. In addition, an interface between the second conductor layer 42b and the third conductor layer 42c of the source electrode 42 preferably has the same height as the electron supply layer 23, and further, preferably has the same height as an interface between the electron supply layer 23 and the protection layer 30.

(Method of Manufacturing Semiconductor Device)

Next, a description will be given of the method of manufacturing the semiconductor device in this embodiment, by referring to FIGS. 15A through 17B. FIGS. 15A, 15B, 16A, 16B, 17A, and 17B are diagrams for explaining the method of manufacturing the semiconductor device in the third embodiment.

Figure 15A:
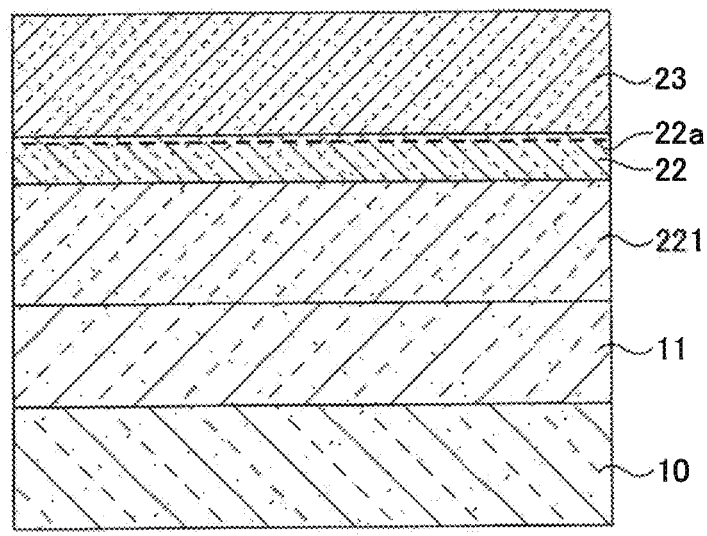
FIGS. 15A and 15B are diagrams for explaining a method of manufacturing the semiconductor device in the third embodiment.

First, the nitride semiconductor layers, such as the buffer layer 11, the semiinsulating semiconductor layer 221 forming the first semiconductor layer, the channel layer 22 forming the second semiconductor layer, and the electron supply layer 23 forming the third semiconductor layer, are successively stacked on the substrate 10 by MOVPE, as illustrated in FIG. 15A. In this embodiment, the substrate 10 is formed by a SiC substrate, and the buffer layer 11 is made of AlN or the like having a thickness of approximately 0.5 µm.

The semiinsulating semiconductor layer 221 forming the first semiconductor layer is made of GaN having a thickness of approximately 0.5 µm, and is doped with an impurity element, Fe, to a concentration of $1 \times 10^{17}/cm^3$. The channel layer 22 forming the second semiconductor layer is made of i-GaN having a thickness of approximately 0.2 µm. The electron supply layer 23 forming the third semiconductor layer is made of n-$Al_{0.25}Ga_{0.75}N$ having a thickness of approximately 20 nm, and is doped with an impurity element, Si, to a concentration of $1 \times 10^{18}/cm^3$. Hence, the 2DEG 22a is generated in the channel layer 22 at the vicinity of the interface between the channel layer 22 and the electron supply layer 23.

Thereafter, an element isolation region that is not illustrated in FIG. 15A is formed. More particularly, a photoresist layer is coated on the surface of the electron supply layer 23, and this photoresist layer is exposed by an exposure apparatus and developed in order to form a resist pattern that is not illustrated in FIG. 15A. This resist pattern has an opening in a region in which the element isolation region is to be formed. Then, the nitride semiconductor layer within the opening of the resist pattern is removed by a dry etching using a chlorine gas, or by ion implantation of Ar ions or the like, in order to form the element isolation region. The resist pattern is thereafter removed by an organic solvent or the like.

Figure 15B:
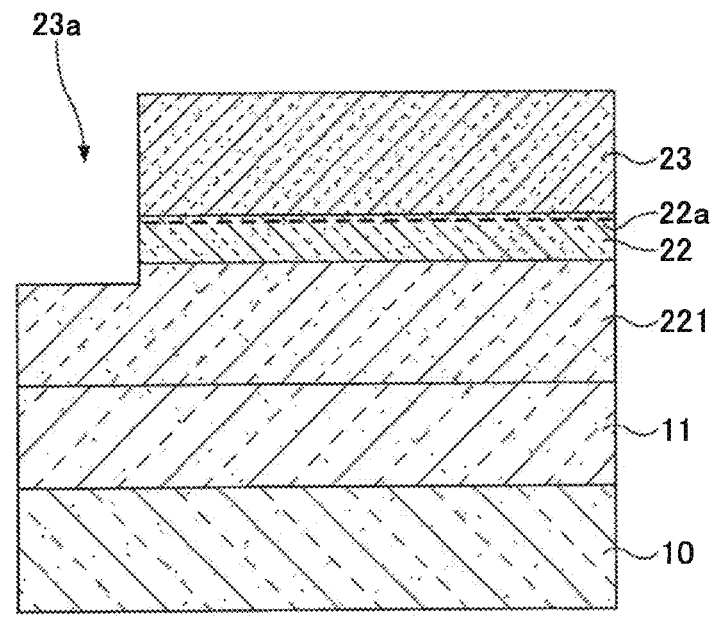

Next, as illustrated in FIG. 15B, an opening 23a is formed by removing a part of the electron supply layer 23, the channel layer 22, and the semiinsulating semiconductor layer 221 in a region where the source electrode 42 is to be formed. More particularly, a photoresist layer is formed on the electron supply layer 23, and this photoresist layer is exposed by the exposure apparatus and developed, in order to form a resist pattern that is not illustrated in FIG. 15B. This resist pattern has an opening in a region in which the source electrode 42 is to be formed. Then, a part of the electron supply layer 23, the channel layer 22, and the semiinsulating semiconductor layer 221 within the opening of the resist pattern is removed by a dry etching using a chlorine gas, in order to form the opening 23a. The resist pattern is thereafter removed by an organic solvent or the like. The dry etching to remove the part of the electron supply layer 23, the channel layer 22, and the semiinsulating semiconductor layer 221 within the opening of the resist pattern may be an RIE or the like.

Figure 16A:
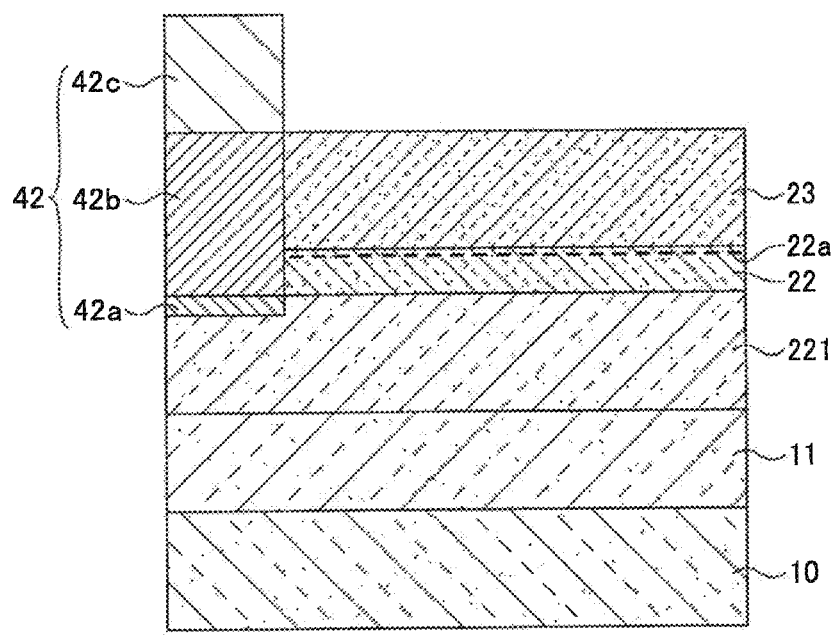
FIGS. 16A and 16B are diagrams for explaining the method of manufacturing the semiconductor device in the third embodiment.

Next, as illustrated in FIG. 16A, the source electrode 42 is formed in the opening 23a. More particularly, a photoresist layer is formed on the surface of the electron supply layer 23, and this photoresist layer is exposed by the exposure apparatus and developed, in order to form a resist pattern that is not illustrated in FIG. 16A. This resist pattern has an opening in a region in which the source electrode 42 is to be formed. Then, stacked metal layers are formed on the resist pattern by successively stacking a metal layer forming the first conductor layer 42a, a metal layer forming the second conductor layer 42b, and a metal layer forming the third conductor layer 42c, by vacuum deposition. The stacked structure is thereafter dipped in an organic solvent or the like, in order to remove the stacked metal layers formed on the resist pattern, together with the resist pattern, by lift-off, and form the source electrode 42 by the remaining stacked metal layers. In this embodiment, the first conductor layer 42a is formed by a Ti layer having a thickness of approximately 20 nm, the second conductor layer 42b is formed by an Ni layer having a thickness of approximately 200 nm, and the third conductor layer 42c is formed by an Al layer having a thickness of approximately 50 nm. Hence, a Schottky junction is formed between the second conductor layer 42b of the source electrode 42 and the channel layer 22 forming the second semiconductor layer, and between the second conductor layer 42b of the source electrode 42 and the electron supply layer 23 forming the third semiconductor layer.

Figure 16B:
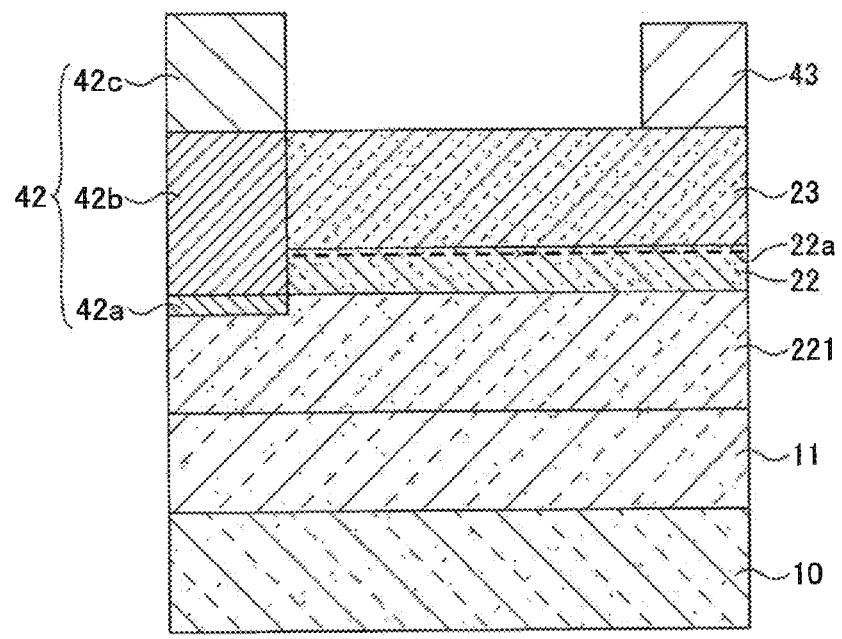

Next, as illustrated in FIG. 16B, the drain electrode 43 is formed on the electron supply layer 23 forming the third semiconductor layer. More particularly, a photoresist layer is formed on the electron supply layer 23, and this photoresist layer is exposed by the exposure apparatus and developed, in order to form a resist pattern that is not illustrated in FIG. 16B. This resist pattern has an opening in a region in which the drain electrode 43 is to be formed. Then, stacked metal layers formed by Ti/Al are formed on the resist pattern by vacuum deposition. The stacked structure is thereafter dipped in an organic solvent or the like, in order to remove the stacked metal layers formed on the resist pattern, together with the resist pattern, by lift-off, and form the drain electrode 43 by the remaining stacked metal layers. The stacked structure is thereafter subjected to a heat treatment at 600° C. for 1 minute under a nitrogen environment, in order to establish the ohmic contact at the drain electrode 43. In this state, an ohmic contact is also established between the first conductor layer 42a of the source electrode 42 and the semiinsulating semiconductor layer 221 forming the first semiconductor layer.

Figure 17A:
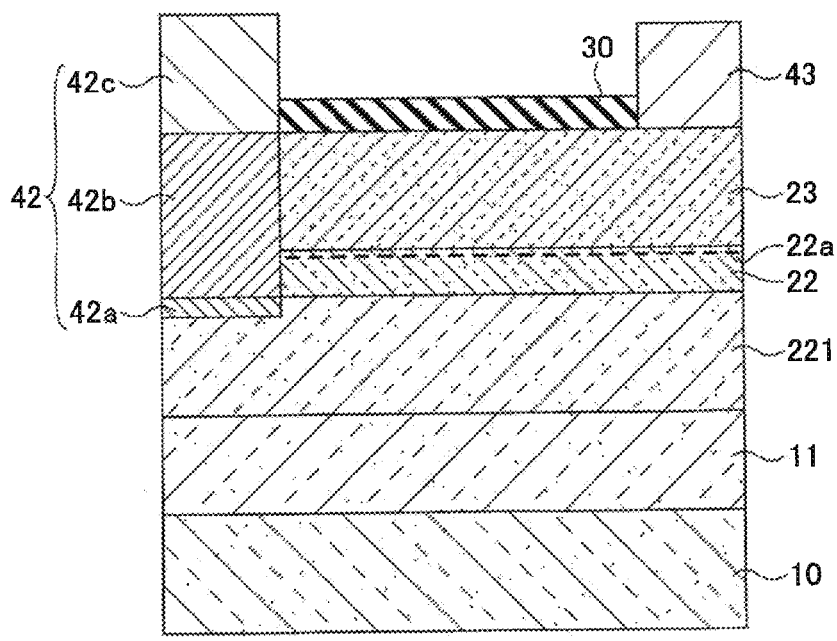
FIGS. 17A and 17B are diagrams for explaining the method of manufacturing the semiconductor device in the third embodiment.

Next, as illustrated in FIG. 17A, the protection layer 30 is formed on the electron supply layer 23 forming the third semiconductor layer. More particularly, an SiN layer is formed on the electron supply layer 23 by plasma CVD, in order to form the protection layer 30.

Figure 17B:
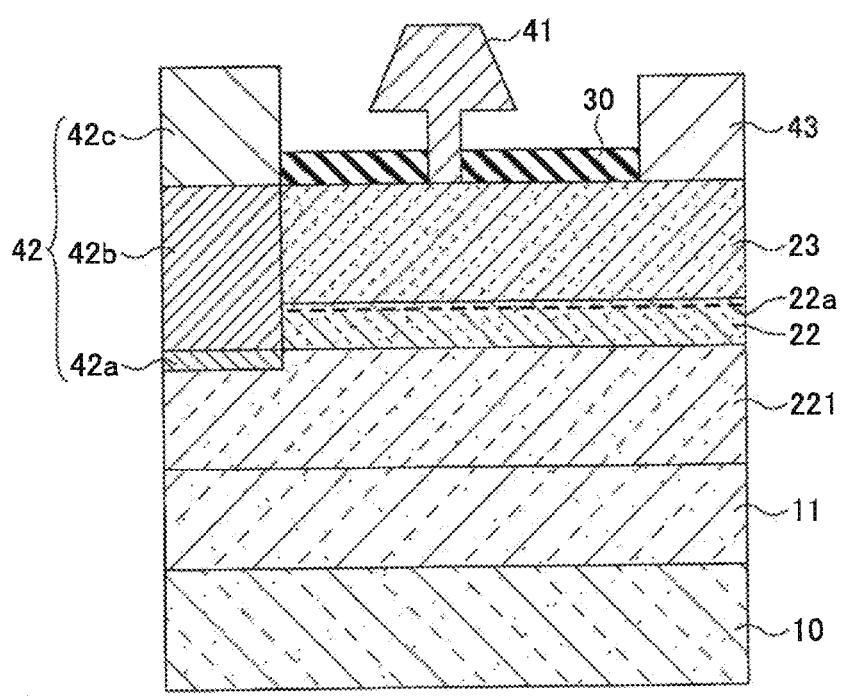

Next, as illustrated in FIG. 17B, a region of the protection layer 30 where the gate electrode 41 is to be formed is removed, in order to expose the electron supply layer 23 within this region and form the gate electrode 41. More particularly, an EB resist layer or the like is coated on the protection layer 30, and this EB resist layer is exposed by an EB exposure of an EB lithography (or exposure) apparatus and developed, in order to form a 3-layer resist pattern having an opening in a region where the gate electrode 41 is to be formed. The protection layer 30 within the opening of this 3-layer resist pattern is removed by an RIE or the like, in order to expose the surface of the electron supply layer 23 within the opening of this 3-layer resist layer. Then, metal stacked layers formed by Ni/Au are formed on the resist pattern by vacuum deposition. The stacked structure is thereafter dipped in an organic solvent or the like, in order to remove the stacked metal layers formed on the resist pattern, together with the resist pattern, by lift-off, and form the gate electrode 41 by the remaining stacked metal layers. In this embodiment, a gate length of the gate electrode 41 that is formed is approximately 0.1 μm.

Otherwise, the semiconductor device in this embodiment is similar in configuration and method of manufacture to the semiconductor device in the first embodiment described above.

[Fourth Embodiment]
(Semiconductor Device)

Figure 18:
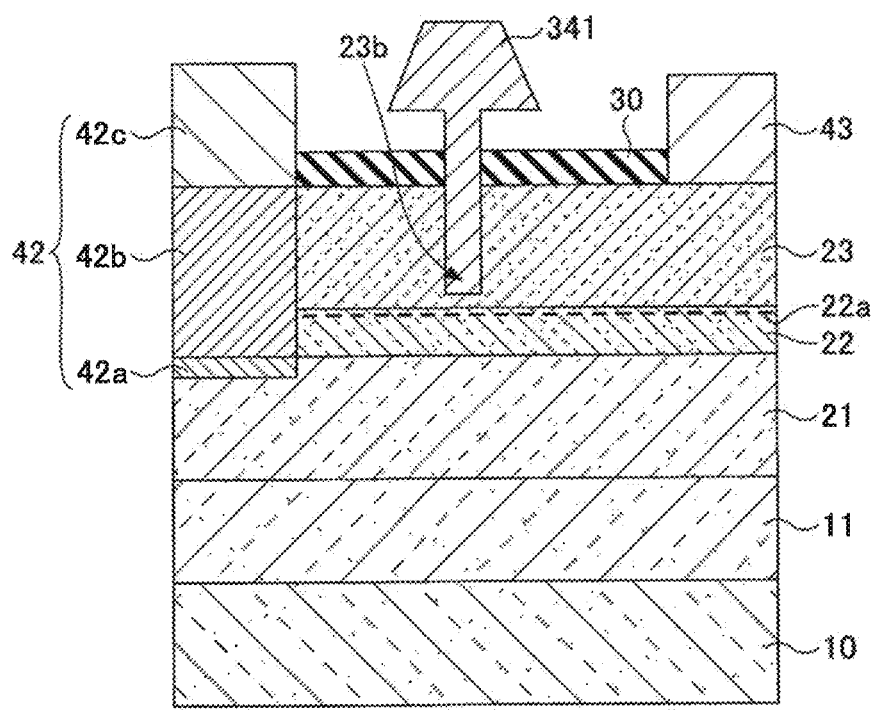
FIG. 18 is a diagram illustrating a configuration of an example of the semiconductor device in a fourth embodiment.

Next, a description will be given of the semiconductor device in a fourth embodiment, by referring to FIG. 18. FIG. 18 is a diagram illustrating a configuration of an example of the semiconductor device in the fourth embodiment. As illustrated in FIG. 18, the semiconductor device in this embodiment includes a buffer layer 11 formed by a nitride semiconductor, a p-type layer 21 forming a first semiconductor layer, a channel layer 22 forming a second semiconductor layer, and an electron supply layer 23 forming a third semiconductor layer that are successively stacked on a substrate 10.

The substrate 10 may be made of non-doped Si, SiC, $Al_2O_3$, GaN, or the like. The substrate 10 is preferably made of a material that is not conductive, and is made of a semiinsulating material or an insulating material that is highly insulative. In this embodiment, the substrate 10 is made of SiC. The buffer 11 is made of AlN or the like having a thickness of approximately 0.5 μm.

The p-type layer 21 forming the first semiconductor layer is made of p-GaN having a thickness of approximately 0.5 μm, and is doped with an impurity element, Mg, to a concentration of $1 \times 10^{17}/cm^3$. The channel layer 22 forming the second semiconductor layer is made of i-GaN having a thickness of approximately 0.2 μm. The electron supply layer 23 forming the third semiconductor layer is made of n-$Al_{0.25}Ga_{0.75}N$ having a thickness of approximately 20 nm, and is doped with an impurity element, Si, to a concentration of $1 \times 10^{18}/cm^3$. Hence, a 2DEG 22a is generated in the channel layer 22 at a vicinity of an interface between the channel layer 22 and the electron supply layer 23. Although not illustrated in FIG. 18, a cap layer made of n-GaN or the like may be formed on the electron supply layer 23 forming the third semiconductor layer.

A source electrode 42 is formed by removing a part of the electron supply layer 23, the channel layer 22, and the p-type layer 21 in a region where the source electrode 42 is to be formed, and filling the region where a part of the nitride semiconductor layer is removed with a conductive material such as a metal material or the like. A drain electrode 43 is formed on the electron supply layer 23. A protection layer 30 is formed in an exposed region of the electron supply layer 23, not formed with the source electrode 42 and the drain electrode 43, by SiN or the like. The protection layer 30 may be formed by a material other than SiN, such as $SiO_2$, $Al_2O_3$, AlN, $HfO_2$, or the like. The protection layer 30 may be formed by plasma CVD, ALD, sputtering, MOCVD, MBE, or the like.

A gate electrode 341 is formed in a region including a gate recess 23b. That is, the protection layer 30 and a part of the electron supply layer 23 are removed in a region where the gate electrode 341 is to be formed, in order to form the gate recess 23b. Thereafter, the gate electrode 341 is formed in the region including the gate recess 23b. The drain electrode 43 is made of a metal stacked layer of Ti/Al, and the gate electrode 41 is made of a metal stacked layer of Ni/Au.

In this embodiment, the source electrode 42 is formed by successively stacking a first conductor layer 42a, a second conductor layer 42b, and a third conductor layer 42c. In this embodiment, the first conductor layer 42a of the source electrode 42 and the p-type layer 21 forming the first semiconductor layer form an ohmic contact. In addition, the second conductor layer 42b of the source electrode 42 and the channel layer 22 forming the second semiconductor layer, and the second conductor layer 42b of the source electrode 42 and the electron supply layer 23 forming the third semiconductor layer respectively form a Schottky junction.

Accordingly, the first conductor layer 42a is made of a material having a relatively small work function, and more particularly, a material having a work function that is less than 5.0 eV, and preferably a material having a work function that is less than 4.5 eV, in order to form the ohmic contact with the p-type layer 21 forming the first semiconductor layer. For example, the first conductor layer 42a may be made of the material including at least one of the materials in Table 1 having the work function that is less than 5.0 eV, namely, Ti, Ta, Mo, Nb, W, Hf, TaN, TiN, or the like. In addition, the first conductor layer 42a may preferably be made of the material including at least one of the materials selected from Table 1 and having the work function that is less than 4.5 eV, namely, Ti, Ta, Nb, Hf, TaN, or the like.

Further, the second conductor layer 42b is made of a material having a relatively large work function, and more particularly, a material having the work function that is 5.0 eV or greater, in order to form the Schottky junction with the electron supply layer 23 forming the third semiconductor layer. For example, the second conductor layer 42b may be made of the material including at least one of the materials selected form Table 1 and having the work function that is 5.0 eV or greater, namely, Ni, Pt, Pd, Ir, Au, or the like.

The third conductor layer 42c is made of a material having a high conductivity, in order to generally reduce the resistance at the source electrode 42. More particularly, the third conductor layer 42c may be made of the material including at least one material selected from Al, Au, Cu, or the like having a high conductivity.

Although not illustrated in FIG. 18, a fourth conductor layer may be formed on the third conductor layer 42c at the source electrode 42. That is, because the third conductor layer 42c is made of the material that is physically weak with respect to heat, the fourth conductor layer made of a metal material or the like that is physically strong against heat may be formed as a cap layer for protecting the third conductor layer 42c.

In this embodiment, an interface between the first conductor layer 42a and the second conductor layer 42b of the source electrode 42 preferably has the same height as an interface between the p-type layer 21 forming the first semiconductor layer and the channel layer 22 forming the second semiconductor layer. In addition, an interface between the second conductor layer 42b and the third conductor layer 42c of the source electrode 42 preferably has the same height as the electron supply layer 23, and further, preferably has the same height as an interface between the electron supply layer 23 and the protection layer 30.

(Method of Manufacturing Semiconductor Device)

Next, a description will be given of the method of manufacturing the semiconductor device in this embodiment, by referring to FIGS. 19A through 21B. FIGS. 19A, 19B, 20A, 20B, 21A, and 21B are diagrams for explaining the method of manufacturing the semiconductor device in the fourth embodiment.

Figure 19A:
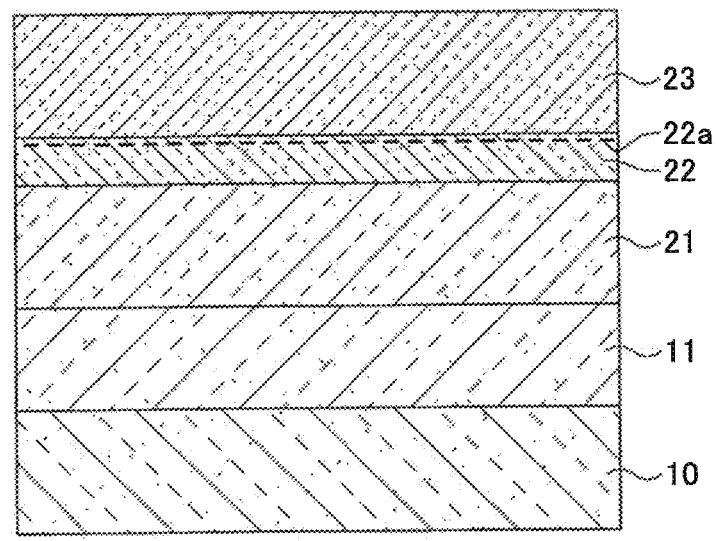
FIGS. 19A and 19B are diagrams for explaining a method of manufacturing the semiconductor device in the fourth embodiment.

First, the nitride semiconductor layers, such as the buffer layer 11, the p-type layer 21 forming the first semiconductor layer, the channel layer 22 forming the second semiconductor layer, and the electron supply layer 23 forming the third semiconductor layer, are successively stacked on the substrate 10 by MOVPE, as illustrated in FIG. 19A. In this embodiment, the substrate 10 is formed by a SiC substrate, and the buffer layer 11 is made of AlN or the like having a thickness of approximately 0.5 µm.

The p-type layer 21 forming the first semiconductor layer is made of p-GaN having a thickness of approximately 0.5 µm, and is doped with an impurity element, Mg, to a concentration of $1 \times 10^{17}/cm^3$. The channel layer 22 forming the second semiconductor layer is made of i-GaN having a thickness of approximately 0.2 µm. The electron supply layer 23 forming the third semiconductor layer is made of n-$Al_{0.25}Ga_{0.75}N$ having a thickness of approximately 20 nm, and is doped with an impurity element, Si, to a concentration of $1 \times 10^{18}/cm^3$. Hence, the 2DEG 22a is generated in the channel layer 22 at the vicinity of the interface between the channel layer 22 and the electron supply layer 23.

Thereafter, an element isolation region that is not illustrated in FIG. 19A is formed. More particularly, a photoresist layer is coated on the surface of the electron supply layer 23, and this photoresist layer is exposed by an exposure apparatus and developed in order to form a resist pattern that is not illustrated in FIG. 19A. This resist pattern has an opening in a region in which the element isolation region is to be formed. Then, the nitride semiconductor layer within the opening of the resist pattern is removed by a dry etching using a chlorine gas, or by ion implantation of Ar ions or the like, in order to form the element isolation region. The resist pattern is thereafter removed by an organic solvent or the like.

Figure 19B:
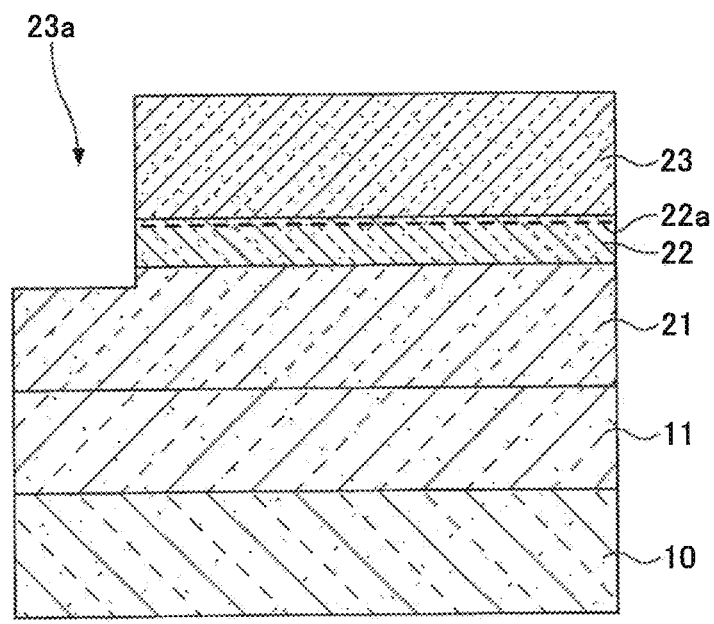

Next, as illustrated in FIG. 19B, an opening 23a is formed by removing a part of the electron supply layer 23, the channel layer 22, and the p-type layer 21 in a region where the source electrode 42 is to be formed. More particularly, a photoresist layer is formed on the electron supply layer 23, and this photoresist layer is exposed by the exposure apparatus and developed, in order to form a resist pattern that is not illustrated in FIG. 19B. This resist pattern has an opening in a region in which the source electrode 42 is to be formed. Then, a part of the electron supply layer 23, the channel layer 22, and the p-type layer 21 within the opening of the resist pattern is removed by a dry etching using a chlorine gas, in order to form the opening 23a. The resist pattern is thereafter removed by an organic solvent or the like. The dry etching to remove the part of the electron supply layer 23, the channel layer 22, and the p-type layer 21 within the opening of the resist pattern may be an RIE or the like.

Figure 20A:
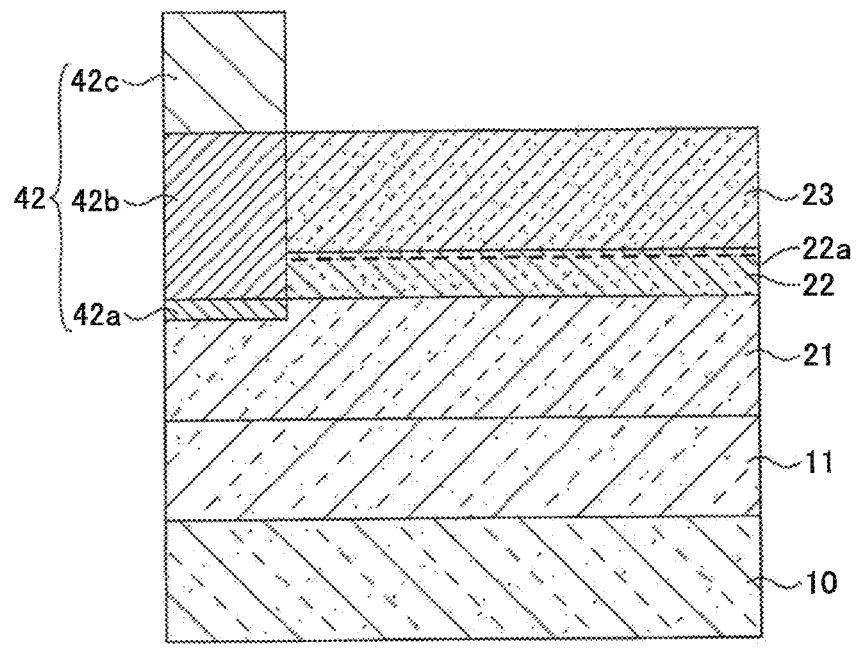
FIGS. 20A and 20B are diagrams for explaining the method of manufacturing the semiconductor device in the fourth embodiment.

Next, as illustrated in FIG. 20A, the source electrode 42 is formed in the opening 23a. More particularly, a photoresist layer is formed on the surface of the electron supply layer 23, and this photoresist layer is exposed by the exposure apparatus and developed, in order to form a resist pattern that is not illustrated in FIG. 20A. This resist pattern has an opening in a region in which the source electrode 42 is to be formed. Then, stacked metal layers are formed on the resist pattern by successively stacking a metal layer forming the first conductor layer 42a, a metal layer forming the second conductor layer 42b, and a metal layer forming the third conductor layer 42c, by vacuum deposition. The stacked structure is thereafter dipped in an organic solvent or the like, in order to remove the stacked metal layers formed on the resist pattern, together with the resist pattern, by lift-off, and form the source electrode 42 by the remaining stacked metal layers. In this embodiment, the first conductor layer 42a is formed by a Ti layer having a thickness of approximately 20 nm, the second conductor layer 42b is formed by an Ni layer having a thickness of approximately 200 nm, and the third conductor layer 42c is formed by an Al layer having a thickness of approximately 50 nm. Hence, a Schottky junction is formed between the second conductor layer 42b of the source electrode 42 and the channel layer 22 forming the second semiconductor layer, and between the second conductor layer 42b of the source electrode 42 and the electron supply layer 23 forming the third semiconductor layer.

Figure 20B:
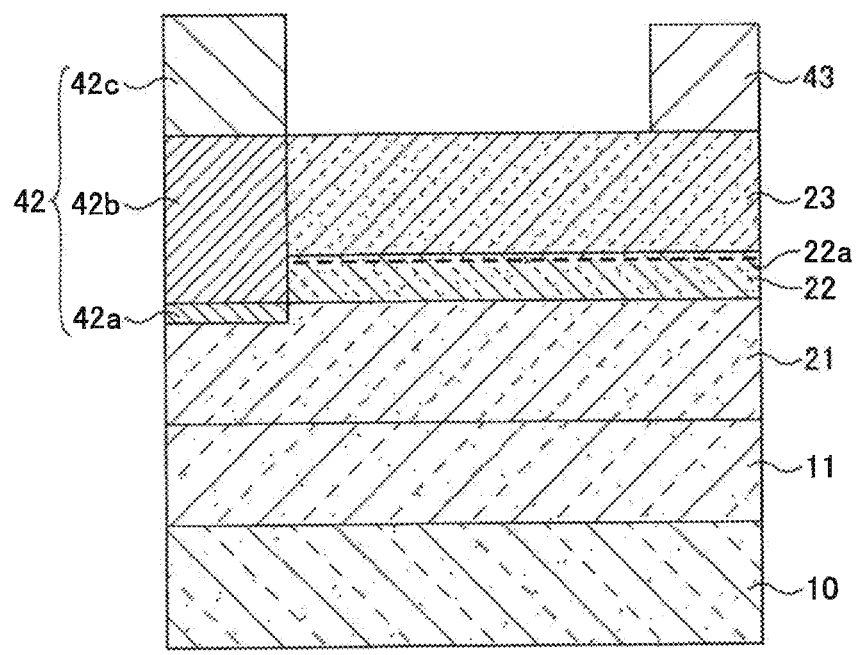

Next, as illustrated in FIG. 20B, the drain electrode 43 is formed on the electron supply layer 23 forming the third semiconductor layer. More particularly, a photoresist layer is formed on the electron supply layer 23, and this photoresist layer is exposed by the exposure apparatus and developed, in order to form a resist pattern that is not illustrated in FIG. 20B. This resist pattern has an opening in a region in which the drain electrode 43 is to be formed. Then, stacked metal layers formed by Ti/Al are formed on the resist pattern by vacuum deposition. The stacked structure is thereafter dipped in an organic solvent or the like, in order to remove the stacked metal layers formed on the resist pattern, together with the resist pattern, by lift-off, and form the drain electrode 43 by the remaining stacked metal layers. The stacked structure is thereafter subjected to a heat treatment at 600° C. for 1 minute under a nitrogen environment, in order to establish the ohmic contact at the drain electrode 43. In this state, an ohmic contact is also established between the first conductor layer 42a of the source electrode 42 and the p-type layer 21 forming the first semiconductor layer.

Figure 21A:
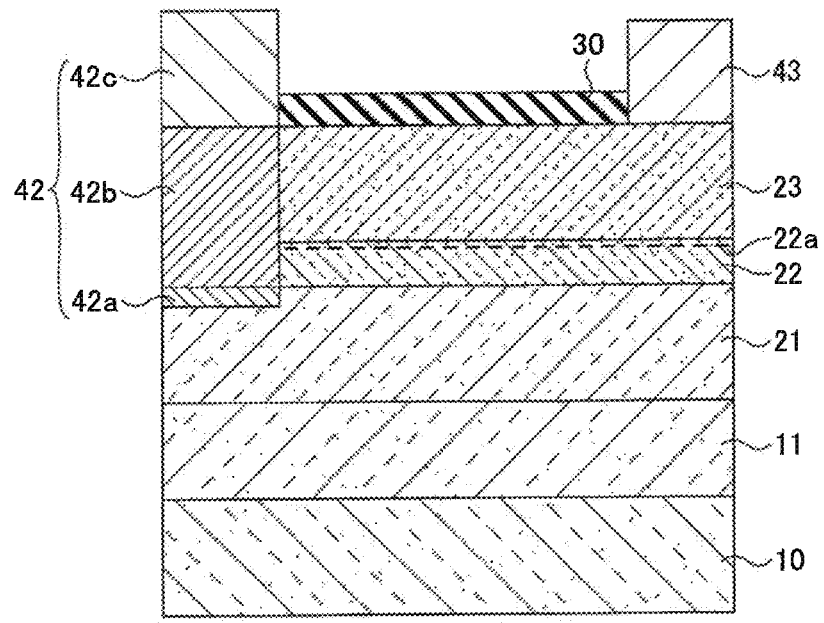
FIGS. 21A and 21B are diagrams for explaining the method of manufacturing the semiconductor device in the fourth embodiment.

Next, as illustrated in FIG. 21A, the protection layer 30 is formed on the electron supply layer 23 forming the third semiconductor layer. More particularly, an SiN layer is formed on the electron supply layer 23 by plasma CVD, in order to form the protection layer 30.

Figure 21B:
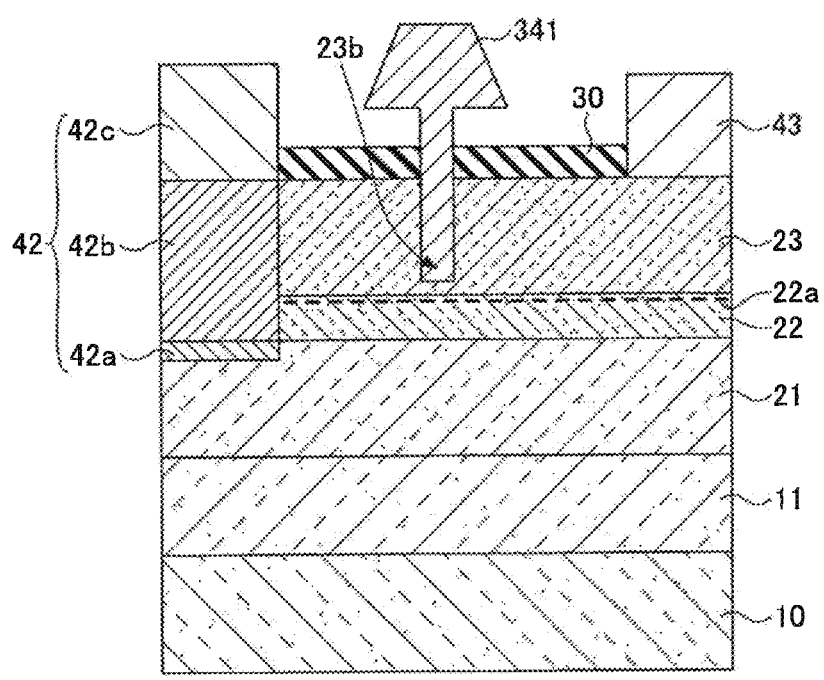

Next, as illustrated in FIG. 21B, a region of the protection layer 30 where the gate electrode 341 is to be formed is removed, and a part of the electron supply layer 23 is also removed, in order to form the gate recess 23b and form the gate electrode 341 in the region including the gate recess 23b. More particularly, an EB resist layer or the like is coated on the protection layer 30, and this EB resist layer is exposed by an EB exposure of an EB lithography (or exposure) apparatus and developed, in order to form a 3-layer resist pattern having an opening in a region where the gate electrode 341 is to be formed. The protection layer 30 and a part of the electron supply layer 23 within the opening of this 3-layer resist pattern are removed by an RIE or the like, in order to form the gate recess 23b in the electron supply layer 23 within the opening of this 3-layer resist layer. Then, metal stacked layers formed by Ni/Au are formed on the resist pattern by vacuum deposition. The stacked structure is thereafter dipped in an organic solvent or the like, in order to remove the stacked metal layers formed on the resist pattern, together with the resist pattern, by lift-off, and form the gate electrode 341 by the remaining stacked metal layers. In this embodiment, a gate length of the gate electrode 341 that is formed is approximately 0.1 μm.

Otherwise, the semiconductor device in this embodiment is similar in configuration and method of manufacture to the semiconductor device in the first embodiment described above.

[Fifth Embodiment]

Next, a description will be given of the semiconductor device, a power supply device, and a high-frequency amplifier in a fifth embodiment.

(Semiconductor Device)

Figure 22:
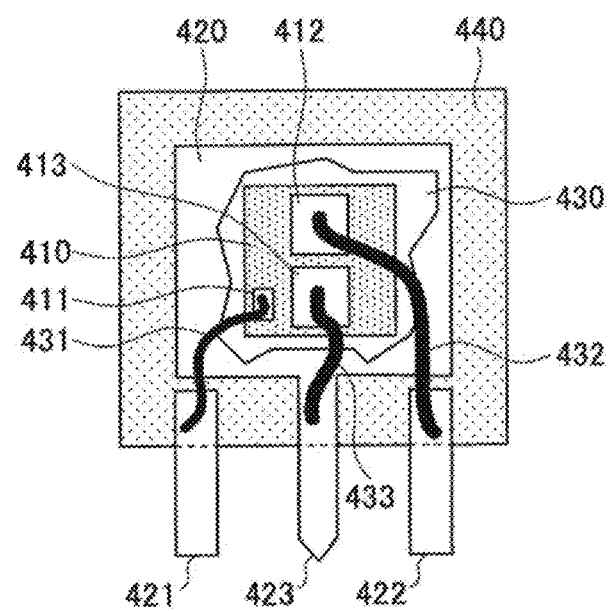
FIG. 22 is a diagram illustrating a configuration of an example of the semiconductor device in a fifth embodiment.

The semiconductor device in this embodiment has a discrete package of the semiconductor device in any of the first through fourth embodiments described above. Next, a description will be given of the semiconductor device having the discrete package in this embodiment, by referring to FIG. 22. FIG. 22 is a diagram illustrating a configuration of an example of the semiconductor device in the fifth embodiment. FIG. 22 schematically illustrates the inside of the discrete package of the semiconductor device, and an arrangement of the electrodes or the like are different from those of the first through fourth embodiments described above.

First, the semiconductor device manufactured according to any of the first through fourth embodiments described above is cut by a dicing process or the like, in order to form a semiconductor chip 410 including a HEMT that uses the GaN semiconductor material. This semiconductor chip 410 is fixed on a lead frame 420 by a die attaching agent 430 such as solder or the like. The semiconductor chip 410 corresponds to the semiconductor device in any of the first through fourth embodiments described above.

Next, a gate electrode 411 is connected to a gate lead 421 by a bonding wire 431, a source electrode 412 is connected to a source lead 422 by a bonding wire 432, and a drain electrode 413 is connected to a drain lead 423 by a bonding wire 433. The bonding wires 431, 432, and 433 is made of a metal material such as Al or the like. In this embodiment, the gate electrode 411 is a kind of a gate electrode pad, and is connected to the gate electrode 41 of the semiconductor device in any of the first through fourth embodiments described above. In addition, the source electrode 412 is a kind of a source electrode pad, and is connected to the source electrode 42 of the semiconductor device in any of the first through fourth embodiments described above. Further, the drain electrode 413 is a kind of a drain electrode pad, and is connected to the drain electrode 43 of the semiconductor device in any of the first through fourth embodiments described above.

Next, a resin encapsulation of the semiconductor device is made by transfer molding using a mold resin 440. Hence, it is possible to manufacture the discrete package of the semiconductor device including the HEMT that uses the GaN semiconductor material.

(PFC Circuit, Power Supply Device, and High-Frequency Amplifier)

Next, a description will be given of the PFC circuit, the power supply device, and the high-frequency amplifier in this embodiment. The PFC circuit, the power supply device, and the high-frequency amplifier in this embodiment uses the semiconductor device of any of the first through fourth embodiments described above.

(PFC Circuit)

Figure 23:
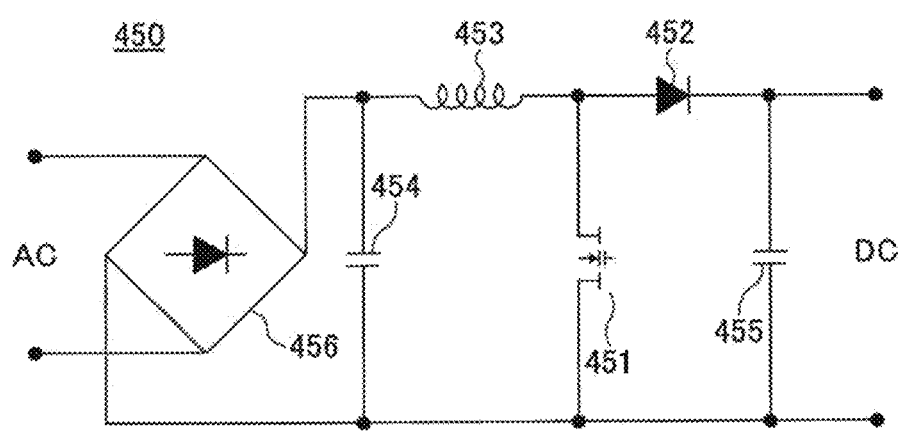
FIG. 23 is a circuit diagram illustrating an example of a PFC (Power Factor Correction) circuit in the fifth embodiment.

Next, a description will be given of the PFC (Power Factor Correction) circuit in this embodiment, by referring to FIG. 23. FIG. 23 is a circuit diagram illustrating an example of the PFC circuit in the fifth embodiment. The PFC circuit in this embodiment uses the semiconductor device of any of the first through fourth embodiments described above.

A PFC circuit 450 illustrated in FIG. 23 includes a switching element (or transistor) 451, a diode 452, a choke coil 453, capacitors 454 and 455, a diode bridge 456, and an A.C. power supply that is not illustrated in FIG. 23. The switching element 451 is formed by the HEMT in the semiconductor device of any of the first through fourth embodiments described above.

In the PFC circuit 450, a drain electrode of the switching element 451, an anode terminal of the diode 452, and one terminal of the choke coil 453 are connected. In addition, a source electrode of the switching element 451, one terminal of the capacitor 454, and one terminal of the capacitor 455 are connected. The other terminal of the capacitor 454 and the other terminal of the choke coil 453 are connected. The other terminal of the capacitor 455 and a cathode terminal of the diode 452 are connected. The A.C. power supply is connected between the two terminals of the capacitor 454 via the diode bridge 456. In the PFC circuit 450 having the configuration illustrated in FIG. 23, a D.C. voltage is output via the two terminals of the capacitor 455.

(Power Supply Device)

Figure 24:
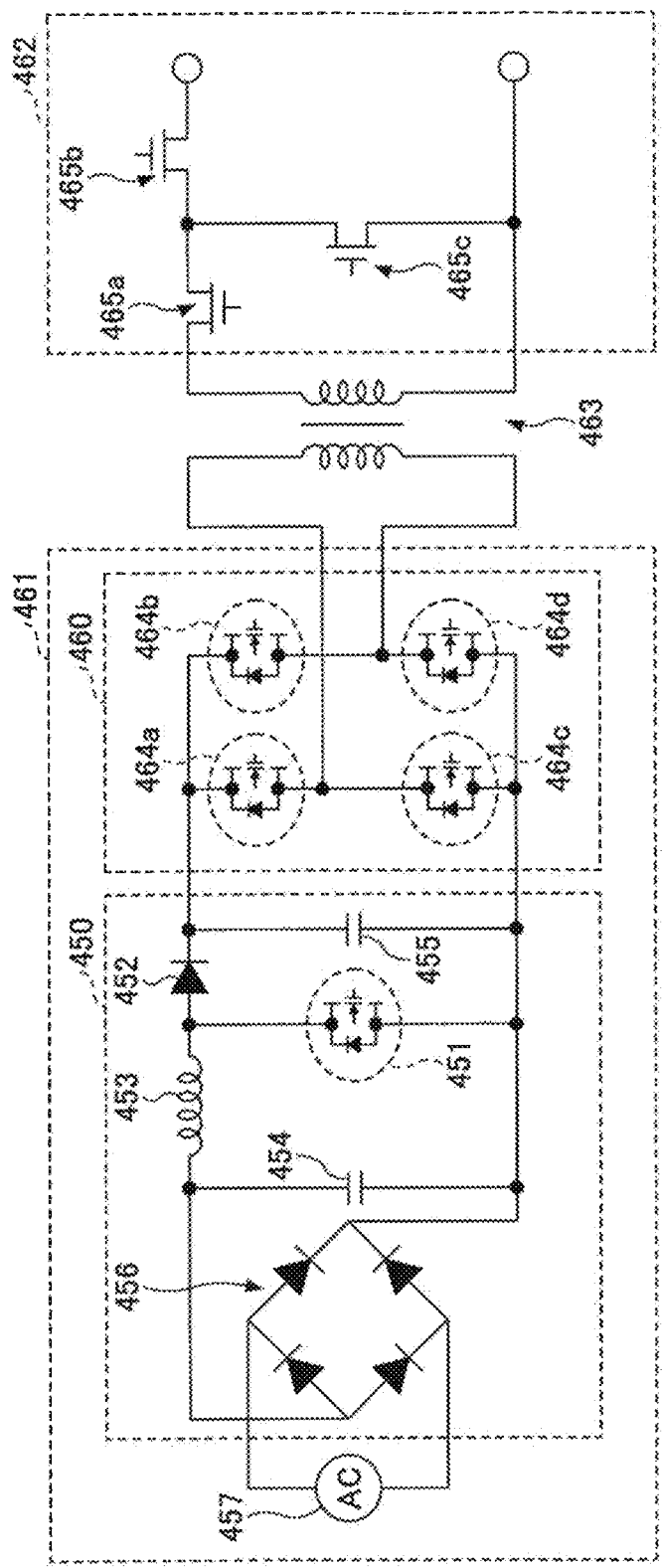
FIG. 24 is a circuit diagram illustrating an example of a power supply device in the fifth embodiment.

Next, a description will be given of the power supply device in this embodiment, by referring to FIG. 24. FIG. 24 is a circuit diagram illustrating an example of a power supply device in the fifth embodiment. The power supply device in this embodiment uses the HEMT in the semiconductor device of any of the first through fourth embodiments described above. The power supply device in this embodiment includes the PFC circuit 450 of this embodiment described above.

A power supply device illustrated in FIG. 24 includes a high-voltage primary side circuit 461, a low-voltage secondary side circuit 462, and a transformer 463 connected between the primary side circuit 461 and the secondary side circuit 462.

The primary side circuit 461 includes the PFC circuit 450 of this embodiment described above, and a full bridge inverter circuit 460 which is an example of an inverter circuit connected between the two terminals of the capacitor 455 of the PFC circuit 450. The full bridge inverter circuit 460 includes a plurality of switching elements, and the secondary side circuit 462 includes a plurality of switching elements. In this example, the full bridge inverter circuit 460 includes four switching elements 464a, 464b, 464c, and 464d, and the secondary side circuit 462 include three switching elements 465a, 465b, and 465c. An A.C. power supply 457 is connected to the diode bridge 456.

In this embodiment, the switching element 451 of the PFC circuit 450 in the primary side circuit 461 uses the HEMT in the semiconductor device of any of the first through fourth embodiments described above. In addition, each of the switching elements 464a, 464b, 464c, and 464d of the full bridge inverter circuit 460 uses the HEMT in the semiconductor device of any of the first through fourth embodiments described above. On the other hand, each of the switching elements 465a, 465b, and 465c of the secondary side circuit 462 uses an FET having the MIS structure using Si.

(High-Frequency Amplifier)

Figure 25:
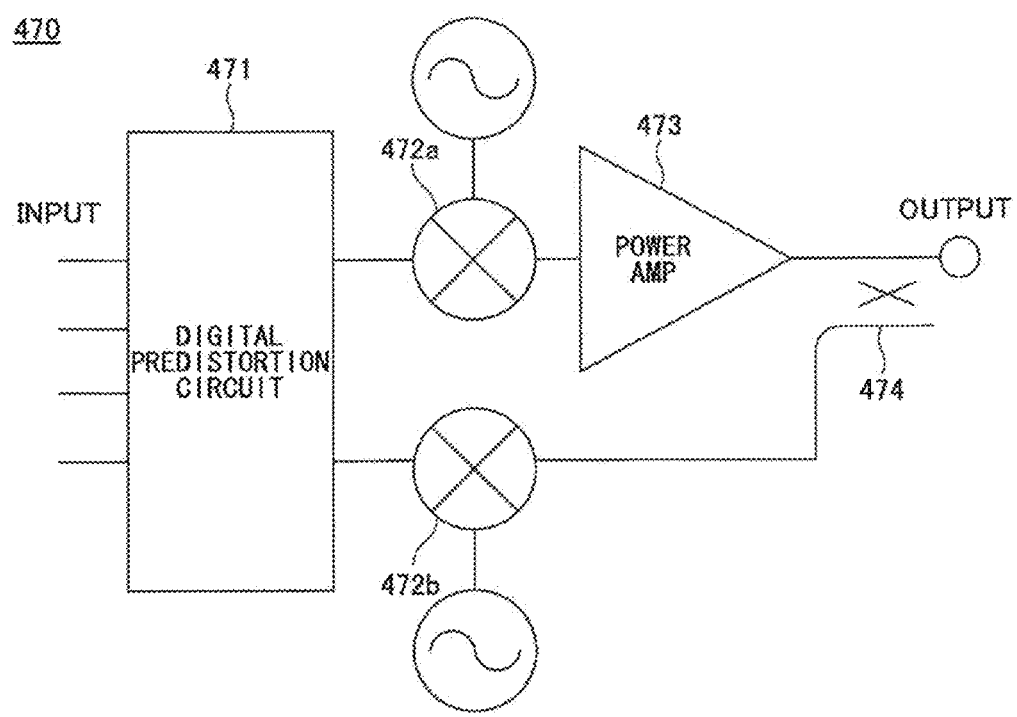
FIG. 25 is a diagram illustrating a configuration of an example of a high-frequency amplifier in the fifth embodiment.

Next, a description will be given of the high-frequency amplifier in this embodiment, by referring to FIG. 25. FIG. 25 is a diagram illustrating an example of the high-frequency amplifier in the fifth embodiment. The high-frequency amplifier in this embodiment uses the HEMT in the semiconductor device of any of the first through fourth embodiments described above.

The high-frequency amplifier illustrated in FIG. 25 includes a digital predistortion circuit 471, mixers 472a and 472b, a power amplifier 473, and a directional coupler 474.

The digital predistortion circuit 471 compensates for a nonlinear distortion of an amplifier output signal. The mixer 472a mixes an A.C. signal and the input signal compensated of the nonlinear distortion. The power amplifier 473 amplifies a mixed output of the mixer 472a, and includes the HEMT in the semiconductor device of any of the first through fourth embodiments described above. The directional coupler 474 monitors the amplifier output signal. In FIG. 25, the A.C. signal and the output signal are mixed by the mixer 472b and a mixed output of the mixer 472b is supplied to the digital predistortion circuit 471, by a switching performed by a switch (not illustrated), for example.

According to the embodiments, it is possible to provide a semiconductor device that uses a nitride semiconductor, has a low ON-resistance, and is operable in a high-frequency region, and to provide a method of manufacturing such a semiconductor device.

Although the embodiments are numbered with, for example, "first," "second," . . . or "fifth," the ordinal numbers do not imply priorities of the embodiments. Many other variations and modifications will be apparent to those skilled in the art.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A semiconductor device, comprising:
a first semiconductor layer made of a nitride semiconductor and formed on a substrate;
a second semiconductor layer made of a nitride semiconductor and formed on the first semiconductor layer;
a third semiconductor layer made of a nitride semiconductor and formed on the second semiconductor layer;
a drain electrode formed on the third semiconductor layer;
a gate electrode formed on the third semiconductor layer; and
a source electrode formed within an opening penetrating the third and second semiconductor layers and exposing the first semiconductor layer, to make direct physical contact with the first, second, and third semiconductor layers,
wherein the source electrode includes a first conductor layer in direct physical contact with the first semiconductor layer, and a second conductor layer stacked on the first conductor layer and in direct physical contact with the second and third semiconductor layers, and
wherein a work function of a material forming the first conductor layer is smaller than a work function of a material forming the second conductor layer.

2. The semiconductor device as claimed in claim 1,
wherein the first conductor layer is in contact with the first semiconductor layer at a bottom of the opening exposing the first semiconductor layer, and
wherein the second conductor layer is in contact with the second and third semiconductor layers at a sidewall defining the opening and exposing the second and third semiconductor layers.

3. The semiconductor device as claimed in claim 1, wherein the first semiconductor layer is made of a p-type material.

4. The semiconductor device as claimed in claim 1, wherein the first semiconductor layer is made of a material doped with Fe as an impurity element thereof.

5. The semiconductor device as claimed in claim 1,
wherein the first conductor layer is made of a material having a work function that is less than 5 eV, and
wherein the second conductor layer is made of a material having a work function that is 5 eV or greater.

6. The semiconductor device as claimed in claim 1,
wherein the first conductor layer is made of a material having a work function that is less than 4.5 eV, and
wherein the second conductor layer is made of a material having a work function that is 4.5 eV or greater.

7. The semiconductor device as claimed in claim 1, wherein the first conductor layer is made of at least one material selected from a group consisting of Ti, Ta, Mo, Nb, W, Hf, TaN, and TiN.

8. The semiconductor device as claimed in claim 1, wherein the first conductor layer is made of at least one material selected from a group consisting of Ti, Ta, Nb, Hf, and TaN.

9. The semiconductor device as claimed in claim 1, wherein the second conductor layer is made of at least one material selected from a group consisting of Ni, Pt, Pd, Ir, and Au.

10. The semiconductor device as claimed in claim 1, wherein an interface between the first conductor layer and the second conductor layer of the source electrode has a height identical to that of an interface between the first semiconductor layer and the second semiconductor layer.

11. The semiconductor device as claimed in claim 1,
wherein the source electrode further includes a third conductor layer formed on the second conductor layer, and
wherein the third conductor layer is made of at least one material selected from a group consisting of Al, Au, and Cu.

12. The semiconductor device as claimed in claim 11, wherein an interface between the second conductor layer and the third conductor layer of the source electrode has a height identical to that of the third semiconductor layer.

13. The semiconductor device as claimed in claim 1, wherein the second semiconductor layer is made of a material including one of GaN and InGaN.

14. The semiconductor device as claimed in claim 1, wherein the third semiconductor layer is made of a material including one of AlGaN, InGaAlN, and InAlN.

15. The semiconductor device as claimed in claim 1, wherein the first semiconductor layer is made of a material including GaN.

16. The semiconductor device as claimed in claim 1,
wherein the third semiconductor layer includes a gate recess in a region in which the gate electrode is formed, and
wherein the gate electrode is formed in the region including the gate recess.

17. The semiconductor device as claimed in claim 1,
wherein the first conductor layer makes contact with the first semiconductor layer at a bottom of the opening exposing the first semiconductor layer, and makes no direct physical contact with the second and third semiconductor layers, and
wherein the second conductor layer makes contact with the second and third semiconductor layers at a sidewall defining the opening and exposing the second and third semiconductor layers.

18. The semiconductor device as claimed in claim 1,
wherein the second conductor layer makes contact with the second and third semiconductor layers at a sidewall defining the opening and exposing the second and third semiconductor layers, and
wherein the first conductor layer makes contact with the first semiconductor layer at a bottom of the opening exposing the first semiconductor layer, and makes contact with the second semiconductor layer at the sidewall.

19. A power supply device, comprising:
a primary side circuit including a plurality of semiconductor devices;
a secondary side circuit; and
a transformer coupled between the primary side circuit and the secondary side circuit,
wherein each of the semiconductor devices includes
   a first semiconductor layer made of a nitride semiconductor and formed on a substrate;
   a second semiconductor layer made of a nitride semiconductor and formed on the first semiconductor layer;
   a third semiconductor layer made of a nitride semiconductor and formed on the second semiconductor layer;
   a drain electrode formed on the third semiconductor layer;
   a gate electrode formed on the third semiconductor layer; and
   a source electrode formed within an opening penetrating the third and second semiconductor layers and exposing the first semiconductor layer, to make direct physical contact with the first, second, and third semiconductor layers,
   wherein the source electrode includes a first conductor layer in direct physical contact with the first semiconductor layer, and a second conductor layer stacked on the first conductor layer and in direct physical contact with the second and third semiconductor layers, and
   wherein a work function of a material forming the first conductor layer is smaller than a work function of a material forming the second conductor layer.

20. An amplifier, comprising:
a semiconductor device that includes
   a first semiconductor layer made of a nitride semiconductor and formed on a substrate;
   a second semiconductor layer made of a nitride semiconductor and formed on the first semiconductor layer;
   a third semiconductor layer made of a nitride semiconductor and formed on the second semiconductor layer;
   a drain electrode formed on the third semiconductor layer;
   a gate electrode formed on the third semiconductor layer; and
   a source electrode formed within an opening penetrating the third and second semiconductor layers and exposing the first semiconductor layer, to make direct physical contact with the first, second, and third semiconductor layers,
   wherein the source electrode includes a first conductor layer in direct physical contact with the first semiconductor layer, and a second conductor layer stacked on the first conductor layer and in direct physical contact with the second and third semiconductor layers, and
   wherein a work function of a material forming the first conductor layer is smaller than a work function of a material forming the second conductor layer.

* * * * *